(12) United States Patent
Kim et al.

(10) Patent No.: US 11,716,878 B2
(45) Date of Patent: Aug. 1, 2023

(54) DISPLAY PANEL AND METHOD OF MANUFACTURING THE SAME

(71) Applicant: Samsung Display Co., Ltd., Yongin-si (KR)

(72) Inventors: Hwiseong Kim, Yongin-si (KR); Hoisoo Kwon, Yongin-si (KR); Seunghwan Kim, Yongin-si (KR); Yujin Ye, Yongin-si (KR); Seunghwan Yu, Yongin-si (KR); Jaeman Lee, Yongin-si (KR); Heewon Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 114 days.

(21) Appl. No.: 17/323,892

(22) Filed: May 18, 2021

(65) Prior Publication Data
US 2022/0005903 A1 Jan. 6, 2022

(30) Foreign Application Priority Data
Jul. 2, 2020 (KR) ........................ 10-2020-0081670

(51) Int. Cl.
*H10K 59/121* (2023.01)
*H10K 50/844* (2023.01)
(Continued)

(52) U.S. Cl.
CPC ....... *H10K 59/1213* (2023.02); *H10K 50/844* (2023.02); *H10K 59/124* (2023.02);
(Continued)

(58) Field of Classification Search
CPC .... H10K 59/12; H10K 59/131; H10K 59/124; H10K 50/844; H10K 77/111; H10K 71/00
See application file for complete search history.

(56) References Cited

U.S. PATENT DOCUMENTS 9,623,633 B2    4/2017   Kim et al.
10,109,811 B2   10/2018   Seo et al.
(Continued)

FOREIGN PATENT DOCUMENTS

KR         10-1149433 B1    5/2012
KR   10-2012-0055997 A    6/2012
(Continued)

OTHER PUBLICATIONS

Nam, H., et al., "Laser Etching Characteristics of ITO/Ag/ITO Conductive Films on Forward/Reverse Sides of Flexible Substrates," J. Korean Inst. Electr. Electron. Mater. Eng., vol. 29, No. 11, Nov. 2016, pp. 707-711.

(Continued)

*Primary Examiner* — Vongsavanh Sengdara
(74) *Attorney, Agent, or Firm* — Lewis Roca Rothgerber Christie LLP

(57) ABSTRACT

A method manufacturing a display device includes: forming a pixel circuit in a display area; forming a sacrificial layer on an insulating layer arranged in a non-display area, the sacrificial layer including an isolated pattern hole; forming functional layers and an opposite electrode of an organic light-emitting diode that extends over the display area and the non-display area, the functional layers and the opposite electrode covering the sacrificial layer; irradiating a laser beam to the opposite electrode through the sacrificial layer and the pattern hole from below a substrate; and lifting off the sacrificial layer from the insulating layer and simultaneously, lifting off the opposite electrode to which the laser beam is irradiated, wherein at least a portion of the functional layers is left on a portion of the insulating layer corresponding to the opposite electrode that is removed.

13 Claims, 17 Drawing Sheets

(51) Int. Cl.
*H10K 59/124* (2023.01)
*H10K 59/131* (2023.01)
*H10K 71/00* (2023.01)
*H10K 77/10* (2023.01)

(52) U.S. Cl.
CPC ........... *H10K 59/131* (2023.02); *H10K 71/00* (2023.02); *H10K 77/111* (2023.02)

(56) References Cited

U.S. PATENT DOCUMENTS

| | | | | |
|---|---|---|---|---|
| 2020/0083475 | A1* | 3/2020 | Kang | H10K 59/131 |
| 2020/0106045 | A1* | 4/2020 | Han | H10K 59/65 |
| 2020/0110495 | A1* | 4/2020 | Han | G06F 3/0412 |
| 2020/0119304 | A1* | 4/2020 | Choi | H10K 59/88 |
| 2020/0161582 | A1* | 5/2020 | Choi | H10K 50/844 |
| 2020/0176526 | A1* | 6/2020 | Yoon | H10K 59/88 |
| 2020/0176538 | A1* | 6/2020 | Um | H10K 59/126 |
| 2020/0176539 | A1* | 6/2020 | Sung | G09G 3/3233 |
| 2020/0203671 | A1* | 6/2020 | Yug | B23K 26/384 |
| 2021/0050555 | A1* | 2/2021 | Lee | H10K 50/805 |
| 2021/0057509 | A1* | 2/2021 | Sakamoto | G09F 9/00 |
| 2022/0059521 | A1* | 2/2022 | Kymissis | H01L 25/50 |

FOREIGN PATENT DOCUMENTS

| | | |
|---|---|---|
| KR | 10-1213492 B1 | 12/2012 |
| KR | 10-2016-0145898 A | 12/2016 |

OTHER PUBLICATIONS

Lee, D.H. et al., "Fabrication of the ITO/Mesh-AG/ITO Transparent Electrode using Ag Nano-Thin Layer with a Mesh Structure and Its Characterization," Journal of the Semiconductor & Display Technology, vol. 18, No. 4, Dec. 2019, 5 pages.

* cited by examiner ically increased. As the area occupied by a display area expands, various functions that are associated with the display apparatuses have been added. In order to add various functions, an opening may be formed in the display area.
DISPLAY PANEL AND METHOD OF MANUFACTURING THE SAME

CROSS-REFERENCE TO RELATED APPLICATION

The present application claims priority to and the benefit of Korean Patent Application No. 10-2020-0081670, filed on Jul. 2, 2020, in the Korean Intellectual Property Office, the disclosure of which is incorporated by reference herein in its entirety.

BACKGROUND

1. Field

Aspects of one or more embodiments relate to a display panel and a method of manufacturing the same.

2. Description of Related Art

Generally, display devices may be used in mobile apparatuses such as smartphones, laptop computers, digital cameras, camcorders, personal digital assistants, notebook computers, and tablet personal computers, or in electronic apparatuses such as desktop computers, televisions, outdoor billboards, display devices for exhibitions, instrument panels for automobiles, and head-up displays (HUDs).

Recently, an area occupied by a display area displaying images in a display apparatus has gradually increased. As the area occupied by a display area expands, various functions that are associated with the display apparatuses have been added. In order to add various functions, an opening may be formed in the display area.

The above information disclosed in this Background section is only for enhancement of understanding of the background and therefore the information discussed in this Background section does not necessarily constitute prior art.

SUMMARY

In display apparatuses including an opening area, particles generated while a non-display area around the opening area is processed, may cause defects or deteriorated display quality. For example, the particles may damage a display element surrounding at least a portion of an opening.

Aspects of one or more embodiments include a display panel in which particles are removed and a method of manufacturing the display panel.

Additional aspects will be set forth in part in the description which follows and, in part, will be more apparent from the description, or may be learned by practice of the presented embodiments of the disclosure.

According to one or more embodiments, a method of manufacturing a display panel including a substrate including an opening area, a display area, and a non-display area, the display area surrounding the opening area, and the non-display area being between the opening area and the display area, includes forming a pixel circuit in the display area, the pixel circuit including at least one thin film transistor, forming a sacrificial layer on an insulating layer arranged in the non-display area, the sacrificial layer including an isolated pattern hole, forming functional layers and an opposite electrode of an intermediate layer of an organic light-emitting diode that extends over the display area and the non-display area, the functional layers and the opposite electrode covering the sacrificial layer including the isolated pattern hole, irradiating a laser beam to the opposite electrode through the sacrificial layer and the isolated pattern hole from below the substrate, and lifting off the sacrificial layer from the insulating layer and simultaneously, lifting off the opposite electrode to which the laser beam is irradiated, wherein at least a portion of the functional layers is left on a portion of the insulating layer corresponding to the opposite electrode that is removed.

According to some embodiments, in the forming of the functional layer and the opposite electrode, the functional layers may extend as one body on a first surface of the sacrificial layer in a direction away from the insulating layer and the isolated pattern hole, and the opposite electrode may extend on the functional layers.

According to some embodiments, in the irradiating of the laser beam, the laser beam may pass through a second surface of the sacrificial layer facing the insulating layer and the functional layers that fill the isolated pattern hole, and be simultaneously irradiated on one surface of the opposite electrode.

According to some embodiments, the second surface of the sacrificial layer may be removed from the insulating layer, a portion of the opposite electrode that is arranged in the isolated pattern hole may be removed from the functional layer, and the functional layer between the insulating layer and the opposite electrode may be left on the insulating layer.

According to some embodiments, the functional layer left on the insulating layer may include a pattern corresponding to the isolated pattern hole.

According to some embodiments, the isolated pattern hole may include a multi-circle type pattern hole formed over an entire area of the sacrificial layer.

According to some embodiments, the isolated pattern hole may include a plurality of dot type pattern holes formed over an entire area of the sacrificial layer.

According to some embodiments, the sacrificial layer may be formed through the same process as a process of forming a pixel electrode of the organic light-emitting diode formed in the display area and may include the same material as the pixel electrode.

According to some embodiments, the method may further include forming a dam in the non-display area through the same process as a process of forming a plurality of insulating layers of an insulating layer arranged between the at least one thin film transistor and each element of the organic light-emitting diode, wherein the functional layers and the opposite electrode may extend as one body on an outer surface of the dam and on the sacrificial layer including the isolated pattern hole.

According to some embodiments, the functional layer left on the insulating layer may surround the opening area in the non-display area corresponding to the sacrificial layer.

According to some embodiments, the method may further include forming a thin-film encapsulation layer over the display area and the non-display area, wherein at least one inorganic encapsulation layer of the thin-film encapsulation layer may extend to a region in which the sacrificial layer is removed.

According to some embodiments, the at least one inorganic encapsulation layer may cover the portion of the functional layer left on the insulating layer and an insulating layer exposed between adjacent functional layers.

According to some embodiments, the intermediate layer may include an emission layer formed in the display area, and at least one functional layer formed on a surface of the emission layer and extending from the display area to the non-display area.

According to one or more embodiments, a display panel includes a substrate including an opening area, a display area, and a non-display area, the display area surrounding the opening area, and the non-display area being between the opening area and the display area, an organic light-emitting diode arranged in the display area and including a pixel electrode, an intermediate layer, and an opposite electrode, a dam of a plurality of layers arranged in the non-display area and including an insulating layer, and a thin-film encapsulation layer extending over the display area and the non-display area, wherein a pattern layer is arranged in a region between the dam and the opening area, the pattern layer surrounding the opening area, and the thin-film encapsulation layer covers the pattern layer.

According to some embodiments, the pattern layer may correspond to at least a portion of functional layers that are patterned on the insulating layer.

According to some embodiments, the portion of the functional layers that are patterned may include a multi-circle type pattern.

According to some embodiments, the portion of the functional layers that are patterned may include a plurality of dot patterns.

According to some embodiments, at least one inorganic encapsulation layer of the thin-film encapsulation layer may cover the portion of the functional layers that are patterned and an insulating layer between the functional layers.

According to some embodiments, the pattern layer may correspond to at least a portion of a patterned conductive layer on the insulating layer.

According to some embodiments, the patterned conductive layer may be arranged on the same layer as the pixel electrode and may include the same material as the pixel electrode.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
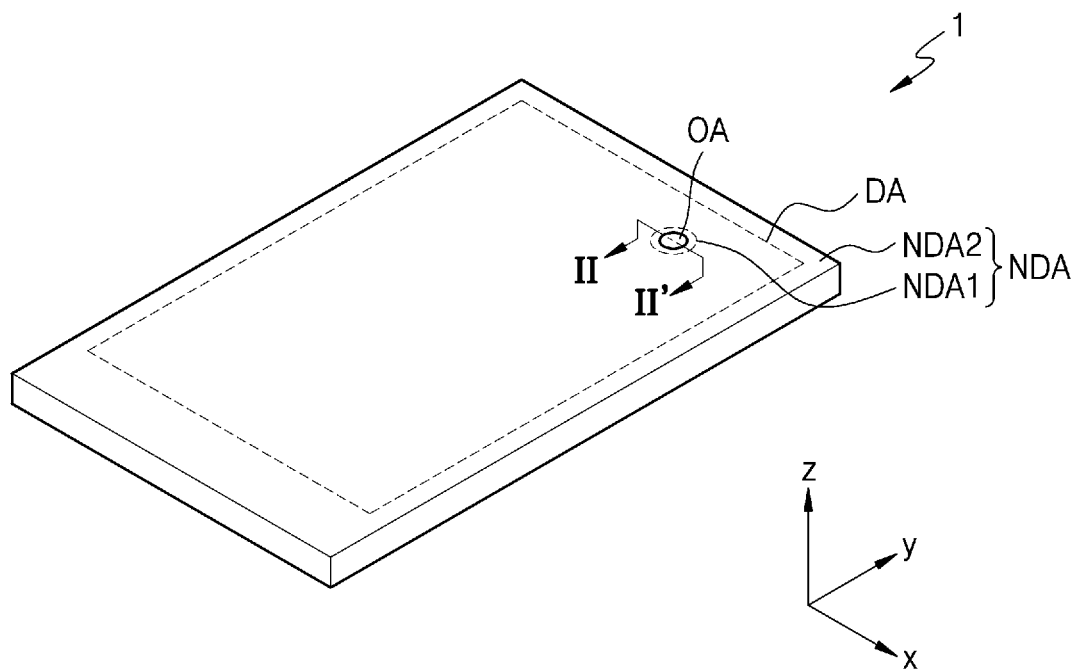
FIG. 1 is a perspective view of a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, aspects of some embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

It will be understood that when a layer, region, or component is referred to as being "formed on," another layer, region, or component, it can be directly or indirectly formed on the other layer, region, or component. That is, for example, intervening layers, regions, or components may be present. Sizes of components in the drawings may be exaggerated for convenience of explanation. In other words, because sizes and thicknesses of components in the drawings are arbitrarily illustrated for convenience of explanation, the following embodiments are not limited thereto.

The x-axis, the y-axis, and the z-axis are not limited to three axes of the rectangular coordinate system, and may be interpreted in a broader sense. As an example, the x-axis, the y-axis, and the z-axis may be perpendicular to one another, or may represent different directions that are not perpendicular to one another.

While such terms as "first," "second," etc., may be used to describe various elements, such elements must not be limited to the above terms. The above terms are used only to distinguish one component from another.

In the following embodiments, an expression used in the singular encompasses the expression of the plural, unless it has a clearly different meaning in the context.

In the following embodiments, it is to be understood that the terms such as "including" and "having" are intended to indicate the existence of the features, or elements disclosed in the present disclosure, and are not intended to preclude the possibility that one or more other features or elements may exist or may be added.

When a certain embodiment may be implemented differently, a specific process order may be performed differently from the described order. As an example, two consecutively described processes may be performed substantially at the same time or performed in an order opposite to the described order.

Hereinafter, embodiments are described in detail with reference to the accompany drawings. When description is made with reference to the drawings, like reference numerals are given to like or corresponding elements, and repeated descriptions thereof are omitted.

It will be understood that when a layer, region, or component is referred to as being "connected" to another layer, region, or component, it may be "directly connected" to the other layer, region, or component and/or may be "indirectly connected" to the other layer, region, or component with other layer, region, or component interposed therebetween. As an example, it will be understood that when a layer, region, or component is referred to as being "electrically connected" to another layer, region, or component, it may be "directly electrically connected" to the other layer, region, or component and/or may be "indirectly electrically connected" to other layer, region, or component with other layer, region, or component interposed therebetween.

FIG. 1 is a perspective view of a display apparatus 1 according to some embodiments.

Referring to FIG. 1, the display apparatus 1 includes a display area DA and a non-display area NDA, the display area DA emitting light, and the non-display area NDA not emitting light. The non-display area NDA may neighbor the display area DA. The display apparatus 1 may display images using light emitted from a plurality of pixels arranged in the display area DA.

The display apparatus 1 includes an opening area OA partially surrounded by the display area DA. According to some embodiments, the opening area OA may be entirely surrounded by the display area DA. The non-display area NDA may include a first non-display area NDA1 and a second non-display area NDA2, the first non-display area NDA1 surrounding the opening area OA, and the second non-display area NDA2 surrounding the display area DA. The first non-display area NDA1 may entirely surround the opening area OA, the display area DA entirely surrounds the first non-display area NDA1, and the second non-display area NDA2 may entirely surround the display area DA.

Hereinafter, though an organic light-emitting display apparatus is illustrated as the display apparatus 1 according to some embodiments, the embodiments according to the present disclosure are not limited thereto. According to some embodiments, the display apparatus may include inorganic light-emitting displays and quantum-dot light-emitting displays.

Figure 2:
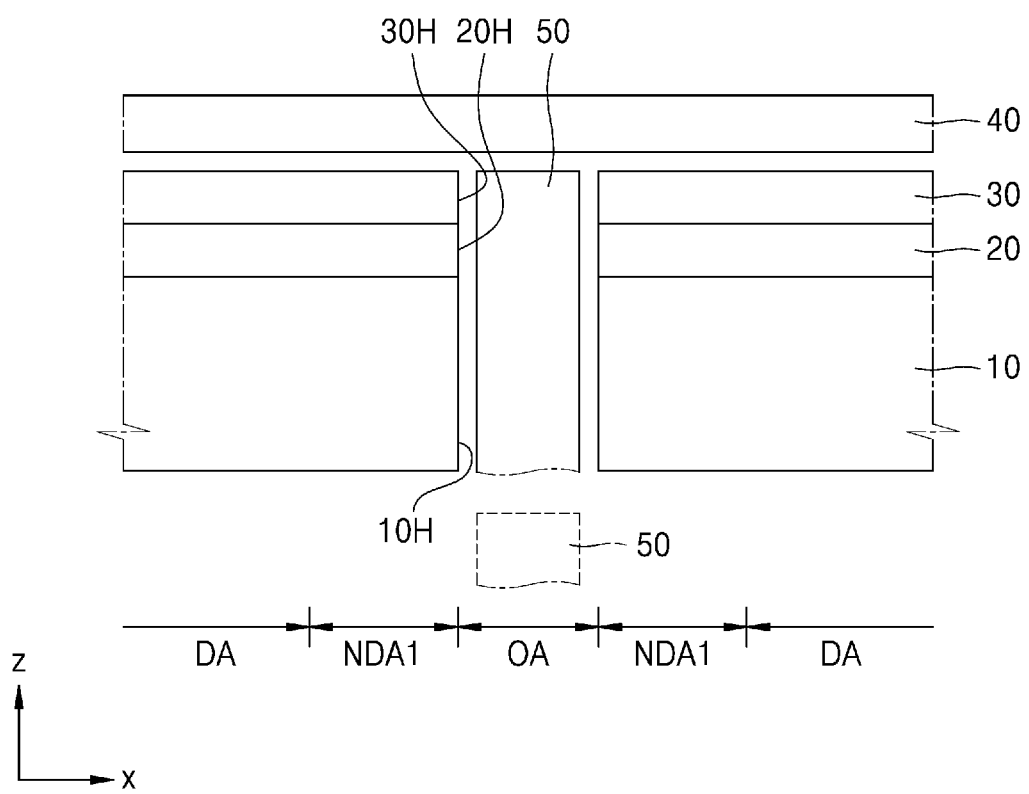
FIG. 2 is a cross-sectional view of a display apparatus according to some embodiments.

FIG. 2 is a cross-sectional view of the display apparatus 1 according to some embodiments, taken along the line II-II' of FIG. 1.

Referring to FIG. 2, the display apparatus 1 may include a display panel 10, an input sensing member 20, and an optical functional member 30, each arranged on the display panel 10. These may be covered by a window 40. The display apparatus 1 may include various electronic apparatuses such as smartphones, notebook computers, and smartwatches.

The display panel 10 displays an image. The display panel 10 includes a plurality of pixels arranged in the display area DA. Each of the pixels may include a display element and a pixel circuit connected thereto. The display element may include an organic light-emitting diode, an inorganic light-emitting diode, or a quantum-dot light-emitting diode.

The input sensing member 20 obtains coordinate information corresponding to an external input, for example, a touch event. The input sensing member 20 may include a sensing electrode and trace lines connected to the sensing electrode. The input sensing member 20 may be arranged on the display panel 10.

The input sensing member 20 may be directly formed on the display panel 10 or separately formed and then coupled to the display panel 10 through an adhesive layer such as an optical clear adhesive (OCA). As an example, the input sensing member 20 may be successively formed after a process of forming the display panel 10. In this case, the adhesive layer may not be arranged between the input sensing member 20 and the display panel 10. Though it is shown that the input sensing member 20 is arranged between the display panel 10 and the optical functional member 30, the input sensing member 20 may be arranged on the optical sensing member 30 according to some embodiments.

The optical functional member 30 may include an anti-reflection layer. The anti-reflection layer may reduce reflectivity of external light incident toward the display panel 10 from the outside through the window 40. The anti-reflection layer may include a retarder and a polarizer. The retarder may include a film-type retarder or a liquid crystal-type retarder. The retarder may include a $\lambda/2$ retarder and/or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals arranged in an arrangement (e.g., a set, predetermined, or preset arrangement). Each of the retarder and the polarizer may further include a protective film. The retarder and the polarizer themselves or the protective film of the retarder and the polarizer may be defined as a base layer of the anti-reflection layer.

According to some embodiments, the anti-reflection layer may include a black matrix and color filters. The color filters may be arranged by considering colors of pieces of light emitted respectively from the pixels. According to some embodiments, the anti-reflection layer may include a destructive interference structure. The destructive interference structure may include a first reflection layer and a second reflection layer respectively arranged on different layers. First-reflected light and second-reflected light respectively reflected by the first reflection layer and the second reflection layer may create destructive interference and thus the reflectivity of external light may be reduced.

The optical functional member 30 may include a lens layer. The lens layer may improve the emission efficiency of light emitted from the display panel 10 or reduce color deviation. The lens layer may include a layer having a concave or convex lens shape or include a plurality of layers having different refractive indexes. The optical functional member 30 may include both the anti-reflection layer and the lens layer, or include one of these layers.

Each of the display panel 10, the input sensing member 20, and the optical functional member 30 may include an opening. According to some embodiments, the display panel 10, the input sensing member 20, and the optical functional member 30 may respectively include first to third openings 10H, 20H, and 30H. The first to third openings 10H, 20H, and 30H may overlap one another. The first to third openings 10H, 20H, and 30H may correspond to the opening area OA. According to some embodiments, at least one of the display panel 10, the input sensing member 20, or the optical functional member 30 may not include an opening.

A component 50 may correspond to the opening area OA. As shown by a solid line, the component 50 may be arranged inside the first to third openings 10H, 20H, and 30H, or as shown by a dashed line, the component 50 may be arranged below the display panel 10.

The component 50 may include an electronic element. As an example, the component 50 may include an electronic element that uses light or sound. As an example, the electronic element may include a sensor such as an infrared sensor that emits and/or receives light, a camera that receives light to capture an image, a sensor that outputs and senses light or sound to measure a distance or recognize a fingerprint, a small lamp that outputs light, and a speaker that outputs sound.

In the case of an electronic element that uses light, the electronic element may use light in various wavelength bands such as visible light, an infrared ray, and an ultraviolet ray. According to some embodiments, the opening area OA may be understood as a transmission area through which light or sound output from the component 50 to the outside or progressing toward the electronic element from the outside may pass.

According to some embodiments, in the case where the display apparatus 1 is used as a smartwatch or an instrument panel for an automobile, the component 50 may be a member such as clock hands or a needle indicating preset information (e.g. the velocity of a vehicle, etc.). In the case where the display apparatus 1 includes clock hands or an instrument panel for an automobile, a portion of the component 50 may pass through the window 40 and be exposed to the outside, and the window 40 may include an opening corresponding to the opening area OA.

The component 50 may include an element(s) related to the functions of the display panel 10 or an element such as an accessory that increases the aesthetic sense of the display panel 10.

Figure 3:
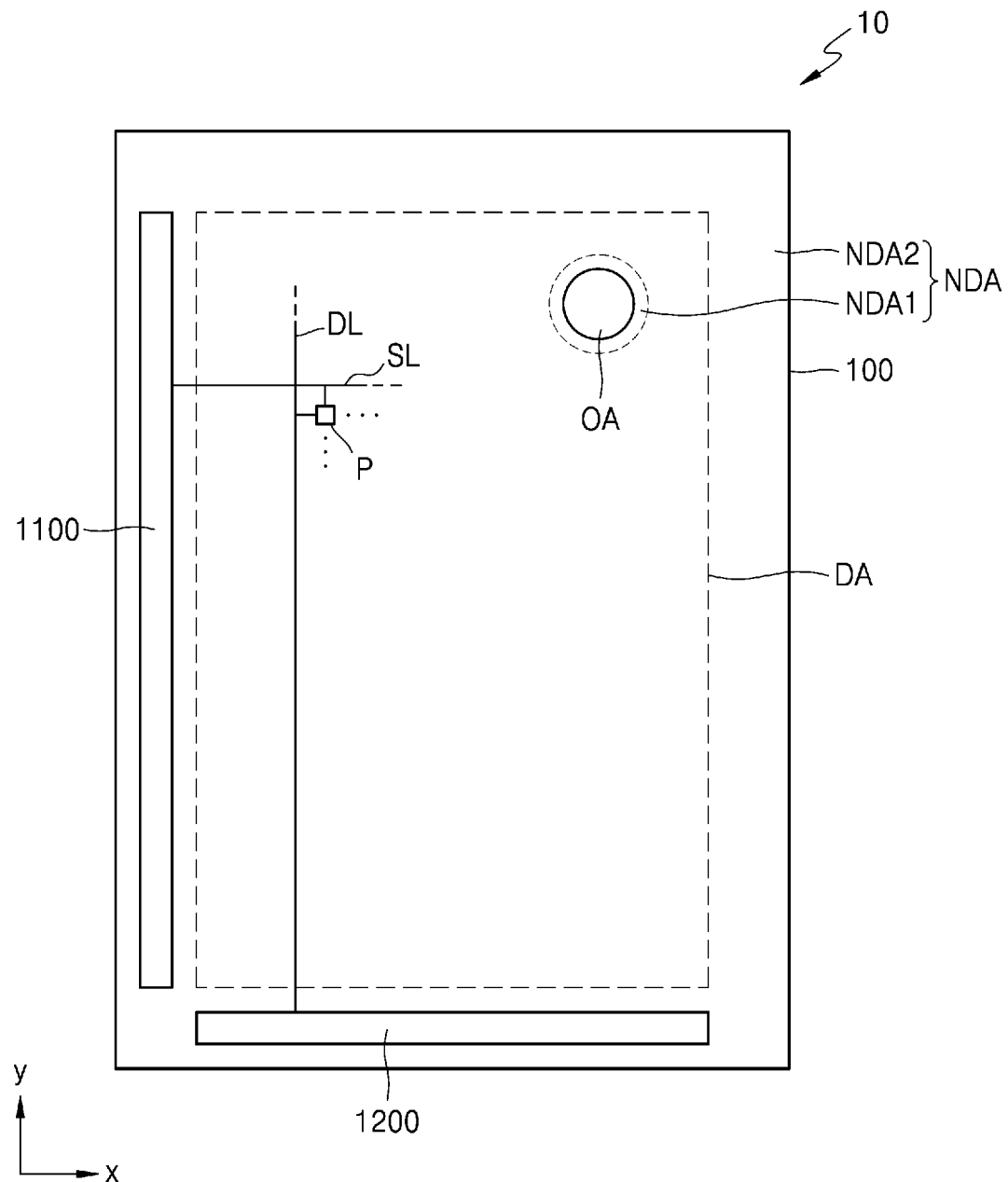
FIG. 3 is a plan view of a display panel according to some embodiments.
Figure 4:
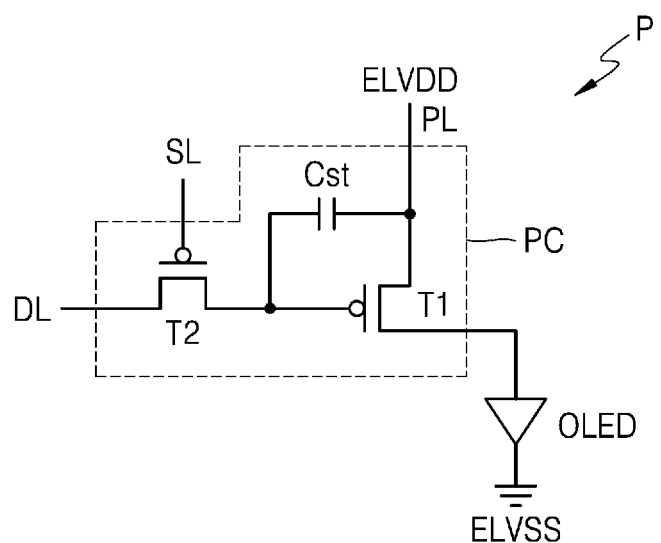
FIG. 4 is an equivalent circuit diagram of a pixel of the display panel of FIG. 3.

FIG. 3 is a plan view of the display panel 10 according to some embodiments, and FIG. 4 is an equivalent circuit diagram of a pixel of the display panel 10 of FIG. 3.

Referring to FIGS. 3 and 4, the display panel 10 includes the display area DA, the first non-display area NDA1, and the second non-display area NDA2. FIG. 3 may be understood as a substrate 100 of the display panel 10. It may be understood that the substrate 100 includes the opening area OA, the display area DA, the first non-display area NDA1, and the second non-display area NDA2.

The display panel 10 includes a plurality of pixels P arranged in the display area DA. Each pixel P includes a pixel circuit PC and an organic light-emitting diode OLED as a display element connected to the pixel circuit PC. The pixel circuit PC includes a driving thin film transistor T1, a switching thin film transistor T2, and a storage capacitor Cst. Each pixel P may emit light having at least one color, for example, red, green, blue, or white light from the organic light-emitting diode OLED.

The switching thin film transistor T2 is connected to a scan line SL and a data line DL and transfers a data voltage to the driving thin film transistor T1 in response to a switching voltage input through the scan line SL, the data voltage being input through the data line DL. The storage capacitor Cst is connected to the switching thin film transistor T2 and a driving voltage line PL and stores a voltage corresponding to a difference between a voltage transferred from the switching thin film transistor T2 and a first power voltage ELVDD supplied to the driving voltage line PL.

The driving thin film transistor T1 is connected to the driving voltage line PL and the storage capacitor Cst and may control a driving current flowing through the organic light-emitting diode OLED from the driving voltage line PL in response to the voltage stored in the storage capacitor Cst. The organic light-emitting diode OLED may emit light having a certain brightness according to the driving current. An opposite electrode (e.g. a cathode) of the organic light-emitting diode OLED may receive a second power voltage ELVSS.

Though FIG. 4 describes the case where the pixel circuit PC includes two thin film transistors and one storage capacitor, the embodiments according to the present disclosure are not limited thereto. The number of thin film transistors and the number of storage capacitors may be variously changed depending on the design of the pixel circuit PC.

Referring to FIG. 3 again, the first non-display area NDA1 may surround the opening area OA. The first non-display area NDA1 may include a region in which a display element such as an organic light-emitting diode that emits light is not arranged. Signal lines may pass across the first non-display area NDA1 or a dam 240 (see, e.g., FIG. 6) may be arranged in the first non-display area NDA1, the signal lines providing a signal to pixels P arranged around the opening area OA. A scan driver 1100, a data driver 1200, a main power line, etc. may be arranged in the second non-display area NDA2, the scan driver 1100 providing a scan signal to each pixel P, the data driver 1200 providing a data signal to each pixel P, and the main power line providing the first and second power voltages. Though it is shown that the data driver 1200 is arranged at the bottom end of the substrate 100 according to some embodiments, the data driver 1200 may be arranged on a flexible printed circuit board (FPCB) electrically connected to a pad arranged on the bottom end of the display panel 10 according to some embodiments.

Figure 5:
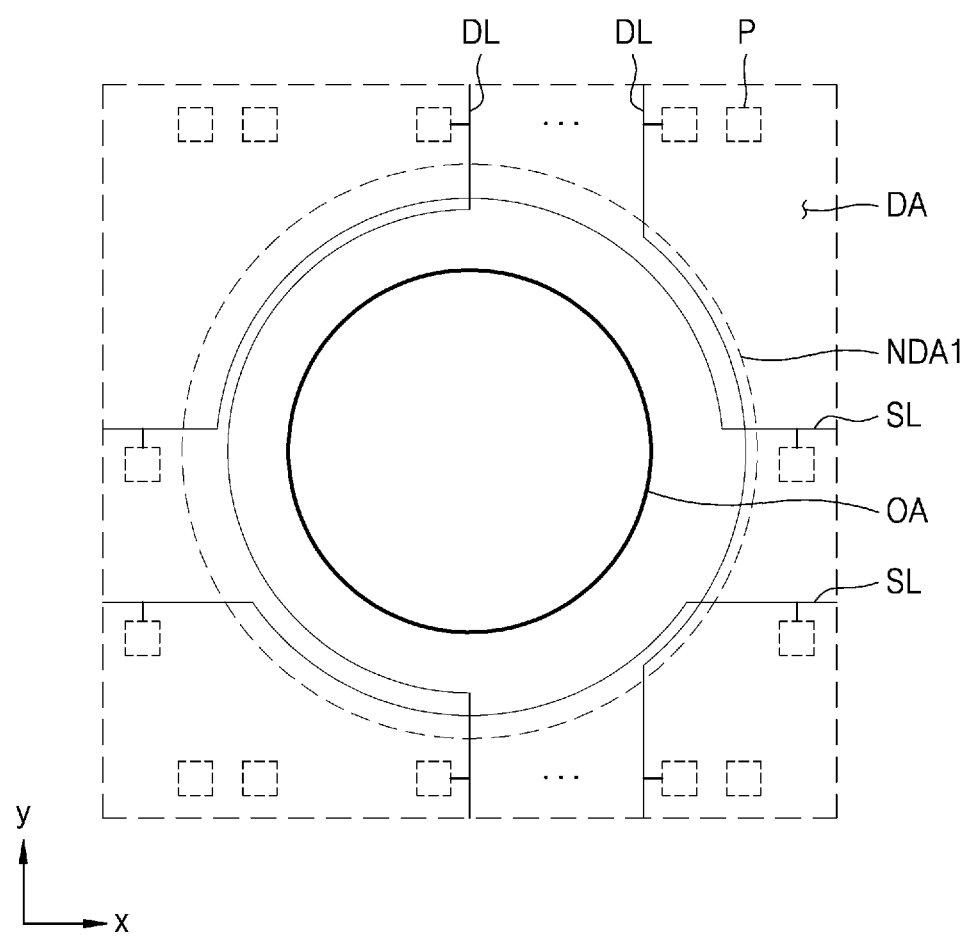
FIG. 5 is an enlarged plan view of a signal line arranged in a first non-display area of a display panel according to some embodiments.

FIG. 5 is an enlarged plan view of a signal line arranged in the first non-display area NDA1 of the display panel 10 according to some embodiments.

Referring to FIG. 5, pixels P may be arranged in the display area DA around the opening area OA, and the first non-display area NDA1 may be arranged between the opening area OA and the display area DA.

The pixels P may be apart from each other with the opening area OA therebetween. The pixels P may be vertically apart from each other with the opening area OA therebetween or be horizontally apart from each other with the opening area OA therebetween.

Among signal lines configured to supply a signal to the pixels P, signal lines neighboring the opening area OA may detour the opening area OA. Some of data lines DL passing across the display area DA may extend in a y-direction to provide a data signal to the pixels P vertically arranged with the opening area OA therebetween and may detour along the edge of the opening area OA in the first non-display area NDA1. Some of scan lines SL passing across the display area DA may extend in an x-direction to provide a scan signal to the pixels P horizontally arranged with the opening area OA therebetween and may detour along the edge of the opening area OA in the first non-display area NDA1.

Figure 6:
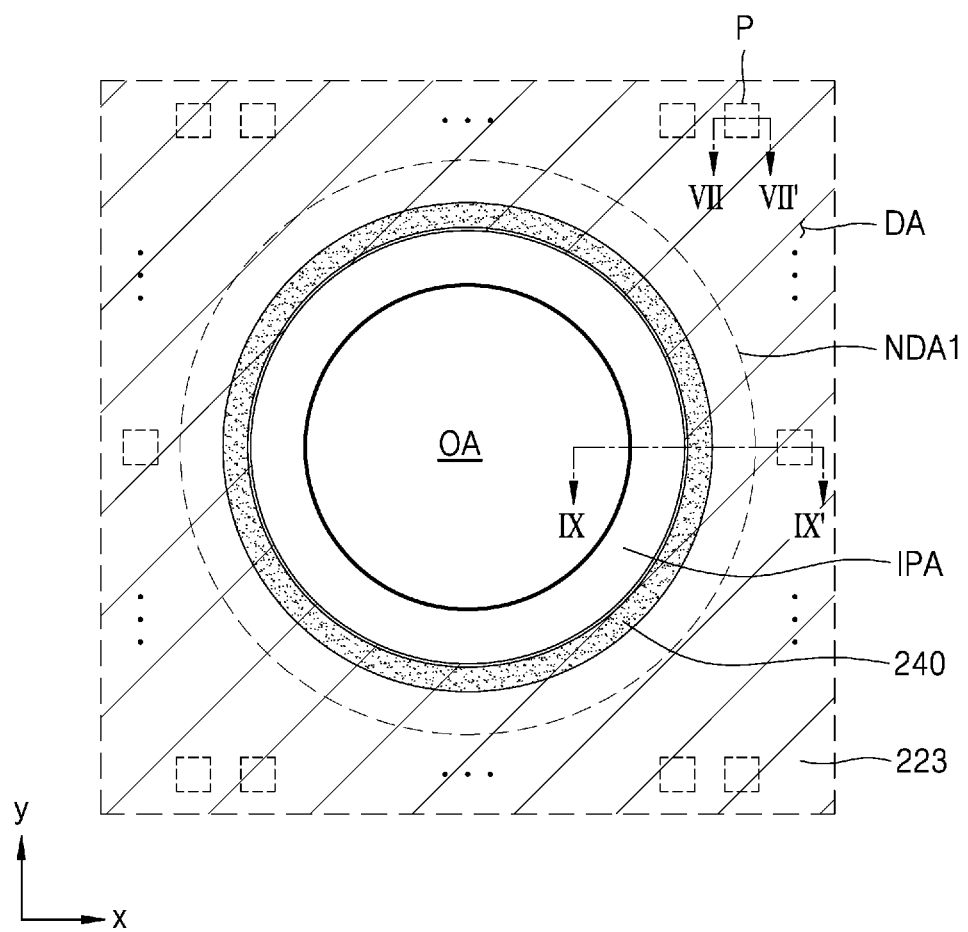
FIG. 6 is an enlarged plan view of each region of a display panel according to some embodiments.

FIG. 6 is an enlarged plan view of each region of the display panel 10 according to some embodiments.

Referring to FIG. 6, at least one dam 240 may be arranged between the opening area OA and the display area DA. The dam 240 may be provided in plural. The dam 240 may be arranged on one of insulating layers arranged over the substrate 100 (see, e.g., FIG. 3).

Because a region IPA between the dam 240 and the opening area OA is a region from which a portion of first and second functional layers 222a and 222c of an intermediate layer 222 (see, e.g., FIG. 7A) including an organic material, and the opposite electrode 223 are removed, the penetration of foreign substances such as moisture, or other contaminants through the opening area OA may be prevented or reduced. In the first non-display area NDA1, the dam 240 may have a ring shape that entirely surrounds the opening area OA. A diameter of the ring shape may be greater than a diameter of the opening area OA.

Figure 7A:
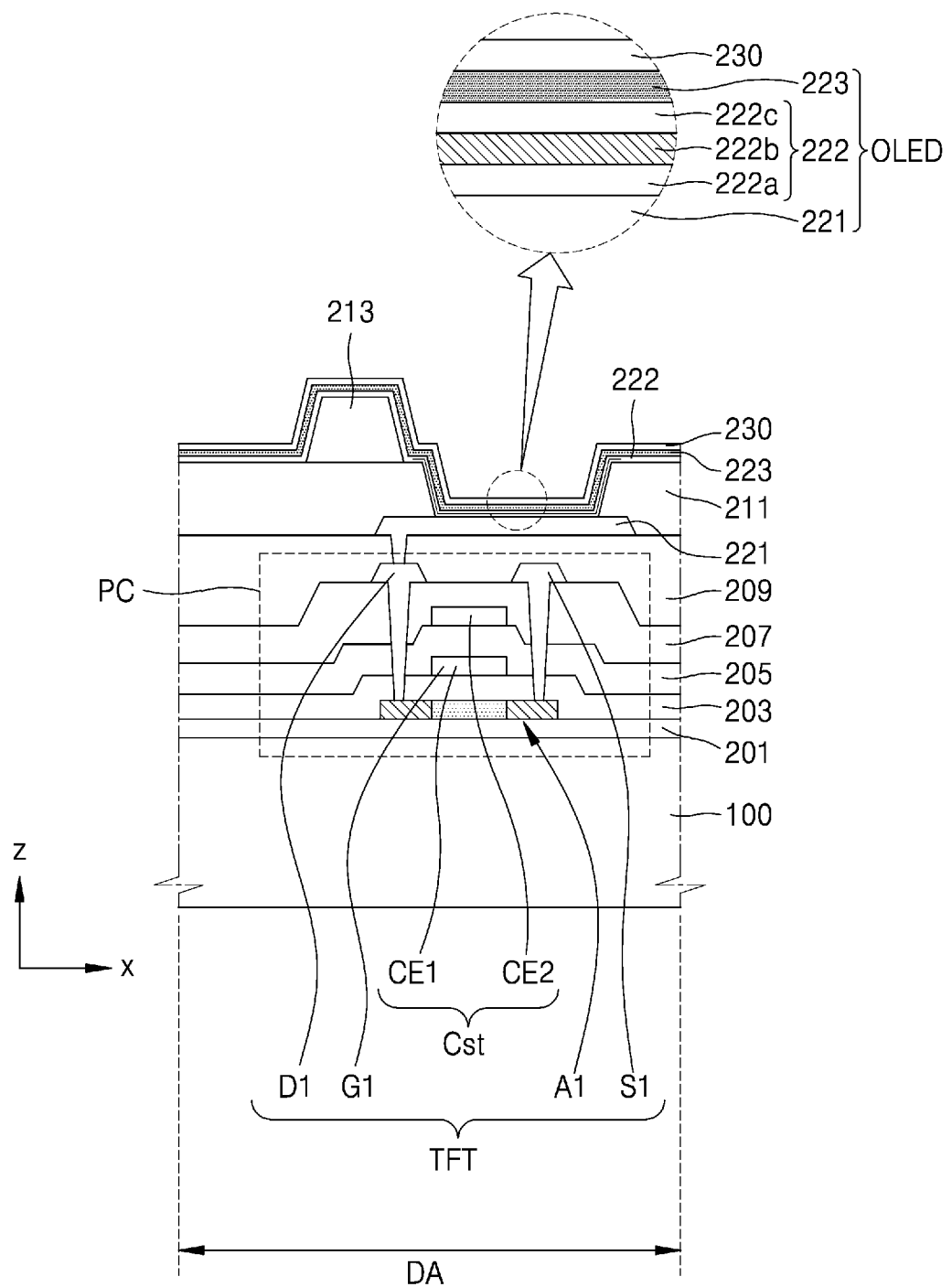
FIGS. 7A and 7B are cross-sectional views of a pixel of a display panel according to some embodiments.

FIG. 7A is a cross-sectional view of a pixel of the display panel 10 according to some embodiments, taken along the line VII-VII' of FIG. 6.

Referring to FIG. 7A, a pixel circuit PC and an organic light-emitting diode OLED may be arranged in the display area DA, the organic light-emitting diode OLED being electrically connected to the pixel circuit PC. The pixel circuit PC may be arranged over the substrate 100. The organic light-emitting diode OLED may be arranged over the pixel circuit PC.

The substrate 100 may include a polymer resin or glass. According to some embodiments, the substrate 100 may include a polymer resin such as polyethersulfone, polyacrylate, polyetherimide, polyethylene naphthalate, polyethylene terephthalate, polyphenylene sulfide, polyimide, polycarbonate, and cellulose acetate propionate and be flexible. According to some embodiments, the substrate 100 may include glass having $SiO_2$ as a main component or include a resin such as a reinforced plastic and be rigid.

A buffer layer 201 may be formed on the substrate 100, the buffer layer 201 preventing or reducing instances of impurities or contaminants penetrating into a first semiconductor layer A1 of a first thin film transistor TFT. The buffer layer 201 may include an inorganic material such as oxide or nitride, an organic material, or an organic/inorganic composite material and have a single-layered structure or a multi-layered structure including an inorganic material and an organic material. A barrier layer may be further included between the substrate 100 and the buffer layer 201, the barrier layer blocking the penetration of external air. According to some embodiments, the buffer layer 201 may include silicon oxide ($SiO_2$) or silicon nitride ($SiN_x$).

The pixel circuit PC may be arranged on the buffer layer 201. The pixel circuit PC includes the first thin film transistor TFT and the storage capacitor Cst. The first thin film transistor TFT may include the first semiconductor layer A1, a first gate electrode G1, a first source electrode S1, and a first drain electrode D1. The first thin film transistor TFT may correspond to the driving thin film transistor T1 of FIG. 4.

Although a top-gate type thin film transistor in which the first gate electrode G1 is arranged over the first semiconductor layer A1 with a first gate insulating layer 203 therebetween is illustrated, the first thin film transistor TFT may include a bottom-gate type thin film transistor according to some embodiments.

The first semiconductor layer A1 may include polycrystalline silicon (poly-Si). Alternatively, the first semiconductor layer A1 may include amorphous silicon, an oxide semiconductor, or an organic semiconductor. The first gate electrode G1 may include a low-resistance metal material. The first gate electrode G1 may include a conductive material including molybdenum (Mo), aluminum (Al), copper (Cu), and titanium (Ti) and include a single layer or a multi-layer.

The first gate insulating layer 203 between the first semiconductor layer A1 and the first gate electrode G1 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 203 may include a single layer or a multi-layer.

The first source electrode S1 and the first drain electrode D1 may include a material having excellent conductivity. The first source electrode S1 and the first drain electrode D1 may include a conductive material including molybdenum (Mo), aluminum (Al), copper (Cu), and titanium (Ti) and include a single layer or a multi-layer. According to some embodiments, the first source electrode S1 and the first drain electrode D1 may include a multi-layer of Ti/Al/Ti.

The storage capacitor Cst includes a bottom electrode CE1 and a top electrode CE2 overlapping each other with a second gate insulating layer 205 therebetween. The storage capacitor Cst may overlap the thin film transistor TFT. According to some embodiments, the first gate electrode G1 of the first thin film transistor TFT may serve as the bottom electrode CE1 of the storage capacitor Cst. According to some embodiments, the storage capacitor Cst may not overlap the first thin film transistor TFT.

The top electrode CE2 of the storage capacitor Cst may include a conductive material including molybdenum (Mo), aluminum (Al), copper (Cu), and titanium (Ti) and include a single layer or a multi-layer.

The second gate insulating layer 205 may serve as a dielectric of the storage capacitor Cst. The second gate insulating layer 205 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second gate insulating layer 205 may include a single layer or a multi-layer.

An interlayer insulating layer 207 may cover the storage capacitor Cst. The interlayer insulating layer 207 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The interlayer insulating layer 207 may include a single layer or a multi-layer.

A planarization layer 209 may cover the pixel circuit PC including the first thin film transistor TFT and the storage capacitor Cst. A top surface of the planarization layer 209 may include an approximately flat surface. The planarization layer 209 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. According to some embodiments, the planarization layer 209 may include polyimide. According to some embodiments, the planarization layer 209 may include an inorganic insulating material or include an inorganic insulating material and an organic insulating material.

The pixel electrode 221 may be arranged on the planarization layer 209. The pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. According to some embodiments, the pixel electrode 221 may further include a layer including ITO, IZO, ZnO, or $In_2O_3$ on/under the reflective layer. As an example, the pixel electrode 221 may have a stack structure of ITO/Ag/ITO. The pixel electrode 221 may include the same material as a sacrificial layer described below.

A pixel-defining layer 211 may be arranged on the pixel electrode 221. The pixel-defining layer 211 may include an opening exposing a top surface of the pixel electrode 221 and cover the edges of the pixel electrode 221. Therefore, the pixel-defining layer 211 may define an emission area of a pixel. The pixel-defining layer 211 may include an organic insulating material. As an example, the pixel-defining layer 211 may be formed through spin coating, etc. and may include an organic insulating material such as polyimide, polyamide, an acrylic resin, benzocyclobutene, hexamethyldisiloxane (HMDSO), and a phenolic resin.

The intermediate layer 222 may include an emission layer 222b. The intermediate layer 222 may include the first functional layer 222a and the second functional layer 222c, the first functional layer 222a being under the emission layer 222b, and the second functional layer 222c being on the emission layer 222b. The emission layer 222b may include a polymer organic material or a low molecular weight organic material emitting light having a certain color.

The first functional layer 222a may include a single layer or a multi-layer. As an example, in the case where the first functional layer 222a includes a polymer material, the first functional layer 222a may include a hole transport layer (HTL), which has a single-layered structure, and include poly(3,4-ethylenedioxythiophene) (PEDOT) or polyaniline (PANI). In the case where the first functional layer 222a includes a low molecular weight material, the first functional layer 222a may include a hole injection layer (HIL) and an HTL.

The second functional layer 222c may be omitted. As an example, in the case where the first functional layer 222a and the emission layer 222b include a polymer material, the second functional layer 222c may be formed. The second functional layer 222c may include a single layer or a multi-layer. The second functional layer 222c may include an electron transport layer (ETL) or an electron injection layer (EIL).

The emission layer 222b of the intermediate layer 222 may be arranged for each pixel in the display area DA. The emission layer 222b may contact a top surface of the pixel electrode 221 exposed through the opening of the pixel-defining layer 211. The first and second functional layers 222a and 222c of the intermediate layer 222 may extend from the display area DA to the first non-display area NDA1.

The opposite electrode 223 may include a conductive material having a low work function. As an example, the opposite electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 223 may further include a layer on the (semi) transparent layer, the layer including ITO, IZO, ZnO, or $In_2O_3$. The opposite electrode 223 may extend from the display area DA to the first non-display area NDA1. The intermediate layer 222 and the opposite electrode 223 may be formed by thermal deposition.

A spacer 213 may be formed on the pixel-defining layer 211. The spacer 213 may include an organic insulating material such as polyimide. The spacer 213 may include the same material as the pixel-defining layer 211. In this case, the pixel-defining layer 211 and the spacer 213 may be simultaneously (or concurrently) formed during a mask process that uses a half-tone mask. According to some embodiments, the spacer 213 may include a material different from that of the pixel-defining layer 211.

A capping layer 230 may be arranged on the opposite electrode 223. The capping layer 230 is a layer configured to protect the opposite electrode 223 and may include an inorganic material or an organic material. According to some embodiments, the capping layer 230 may be omitted.

Figure 7B:
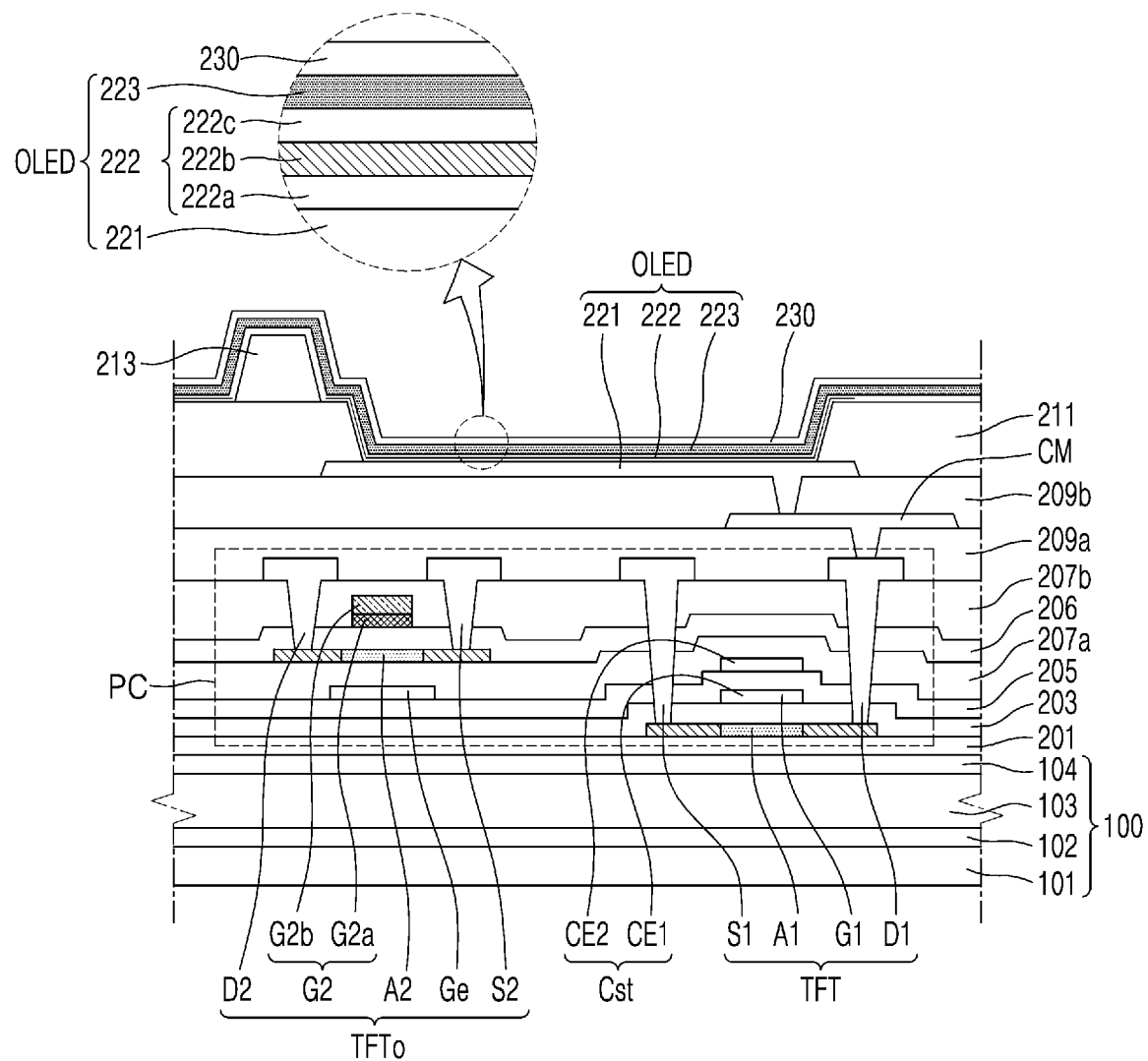

FIG. 7B is a cross-sectional view of a pixel of the display panel 10 according to some embodiments, taken along the line VII-VII' of FIG. 6. In FIG. 7B, because the same reference numerals as those of FIG. 7A denote the same members, repeated descriptions thereof are omitted.

Referring to FIG. 7B, the pixel circuit PC and the organic light-emitting diode OLED may be arranged in the display area DA, the organic light-emitting diode OLED being electrically connected to the pixel circuit PC. The pixel circuit PC may include a first thin film transistor TFT including the first semiconductor layer A1 including polycrystalline silicon and a second thin film transistor TFTo including a semiconductor layer A2 including an oxide semiconductor.

The first thin film transistor TFT includes the first semiconductor layer A1, a first gate electrode G1, a first source electrode S1, and a first drain electrode D1. The first thin film transistor TFT is substantially the same as the first thin film transistor TFT of FIG. 7A, and the first semiconductor layer A1 of the first thin film transistor TFT may include polycrystalline silicon.

An insulating layer according to some embodiments of the present disclosure includes a first interlayer insulating layer 207a, a second interlayer insulating layer 207b, a first planarization layer 209a, and a second planarization layer 209b. In addition, the substrate 100 may have a multi-layered structure.

The substrate 100 may include a first base layer 101, a first inorganic barrier layer 102, a second base layer 103, and a second inorganic barrier layer 104 that are sequentially stacked. The first base layer 101 and the second base layer 103 may each include a polymer resin. The first inorganic barrier layer 102 and the second inorganic barrier layer 104 include barrier layers configured to prevent or reduce instances of the impurities or contaminants penetrating from the outside, include an inorganic material such as silicon oxide ($SiO_2$), silicon nitride ($SiN_x$), and silicon oxynitride (SiON), and include a single layer or a multi-layer.

The second thin film transistor TFTo may include the second semiconductor layer A2, a second gate electrode G2, a second source electrode S2, and a second drain electrode D2. In addition, the second thin film transistor TFTo may further include a bottom gate electrode Ge.

The second semiconductor layer A2 may be arranged on the first interlayer insulating layer 207a. According to some embodiments, the second semiconductor layer A2 may be arranged on a layer different from the first semiconductor layer A1. The second semiconductor layer A2 may include a channel region, a source region, and a drain region, the source region and the drain region being respectively arranged on two opposite sides of the channel region.

According to some embodiments, the second semiconductor layer A2 may include an oxide semiconductor. As an example, the second semiconductor layer A2 may include Zn-oxide-based material and include Zn-oxide, In—Zn oxide, and Ga—In—Zn oxide. Alternatively, the second semiconductor layer A2 may include IGZO (In—Ga—Zn—O), ITZO (In—Sn—Zn—O), or IGTZO (In—Ga—Sn—Zn—O) semiconductor containing metal such as indium (In), gallium (Ga), and stannum (Sn) in ZnO.

The source region and the drain region of the second semiconductor layer A2 may be formed by adjusting carrier concentration of an oxide semiconductor and making the source region and the drain region conductive. As an example, the source region and the drain region of the second semiconductor layer A2 may be formed by increasing carrier concentration through plasma treatment that uses a hydrogen (H)-based gas, a fluorine (F)-based gas, or a combination of these performed on the oxide semiconductor.

The second gate electrode G2 may overlap the channel region of the second semiconductor layer A2. A third gate insulating layer 206 may be arranged between the second semiconductor layer A2 and the second gate electrode G2. According to some embodiments, the second gate electrode G2 may be insulated from the second semiconductor layer A2 by the third gate insulating layer 206. Though the third gate insulating layer 206 may be formed over an entire top surface of the substrate 100, the embodiments according to the present disclosure are not limited thereto and the third gate insulating layer 206 may be patterned along the shape of the second gate electrode G2.

The second gate electrode G2 may include a conductive material including molybdenum (Mo), aluminum (Al), copper (Cu), and titanium (Ti) and include a single layer or a multi-layer. The second gate electrode G2 may include a first layer G2a and a second layer G2b, the first layer G2a including titanium (Ti), and the second layer G2b including molybdenum (Mo).

The third gate insulating layer 206 may include an inorganic material including oxide or nitride. As an example, the third gate insulating layer 206 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate electrode G2 may be arranged on the third gate insulating layer 206, may include at least one of molybdenum (Mo), copper (Cu), or titanium (Ti), and may include a single layer or multiple layers.

The bottom gate electrode Ge may be arranged below the second semiconductor layer A2, the bottom gate electrode Ge overlapping a channel region of the second semiconductor layer A2. The bottom gate electrode Ge may be arranged on the same layer as the top electrode CE2 of the storage capacitor Cst. The first interlayer insulating layer 207a may be arranged between the bottom gate electrode Ge and the second semiconductor layer A2.

The second interlayer insulating layer 207b may cover the second gate electrode G2 of the second thin film transistor TFTo. The second source electrode S2, and the second drain electrode D2 may be arranged on the second interlayer insulating layer 207b.

The first interlayer insulating layer 207a and the second interlayer insulating layer 207b may include an inorganic material including oxide or nitride. As an example, the first interlayer insulating layer 207a and the second interlayer insulating layer 207b may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second source electrode S2 and the second drain electrode D2 may be respectively connected to the source region and the drain region of the second semiconductor layer A2 through contact holes passing through the second interlayer insulating layer 207b. The second source electrode S2 and the second drain electrode D2 may include a conductive material including molybdenum (Mo), aluminum (Al), copper (Cu), and titanium (Ti) and include a single layer or a multi-layer.

Because a thin film transistor including a semiconductor layer including polycrystalline silicon has a high reliability, the thin film transistor may be employed as the driving thin film transistor to implement a high-quality display panel.

Because the thin film transistor including a semiconductor layer including an oxide semiconductor has a high carrier mobility and a low leakage current, a voltage drop is not large even when a driving time is long. That is, because a color change of an image according to a voltage drop is not large even during a low-frequency driving, a display panel may be driven at low frequencies. Because an oxide semiconductor may generally have a relatively low leakage current, instances of a leakage current may be prevented or reduced and simultaneously (or concurrently), power consumption may be reduced by employing an oxide semiconductor as at least one of other thin film transistors in addition to the driving thin film transistor.

The first planarization layer 209a and the second planarization layer 209b may be provided on the second interlayer insulating layer 207b. Because conductive patterns such as wirings may be formed between the first planarization layer 209a and the second planarization layer 209b, it may be enable relatively high integration.

The first planarization layer 209a may cover the pixel circuit PC. The second planarization layer 209b may be arranged on the first planarization layer 209a. The first planarization layer 209a and the second planarization layer 209b may include an organic material or an inorganic material and include a single layer or a multi-layer. The first planarization layer 209a and the second planarization layer 209b may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, or a vinyl alcohol-based polymer. According to some embodiments, the first planarization layer 209a and the second planarization layer 209b may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). While the first planarization layer 209a and the second planarization layer 209b are formed, to provide a flat top surface, chemical mechanical polishing may be performed on a top surface thereof.

The organic light-emitting diode OLED is arranged on the second planarization layer 209b. The pixel electrode 221 of the organic light-emitting diode OLED may be connected to the pixel circuit PC through a connection metal CM arranged on the first planarization layer 209a.

The connection metal CM may be arranged between the first planarization layer 209a and the second planarization layer 209b. The connection metal CM may include a conductive material including molybdenum (Mo), aluminum (Al), copper (Cu), and titanium (Ti) and include a single layer or a multi-layer. As an example, the connection metal CM may have a multi-layered structure of Ti/Al/Ti.

Figure 8:
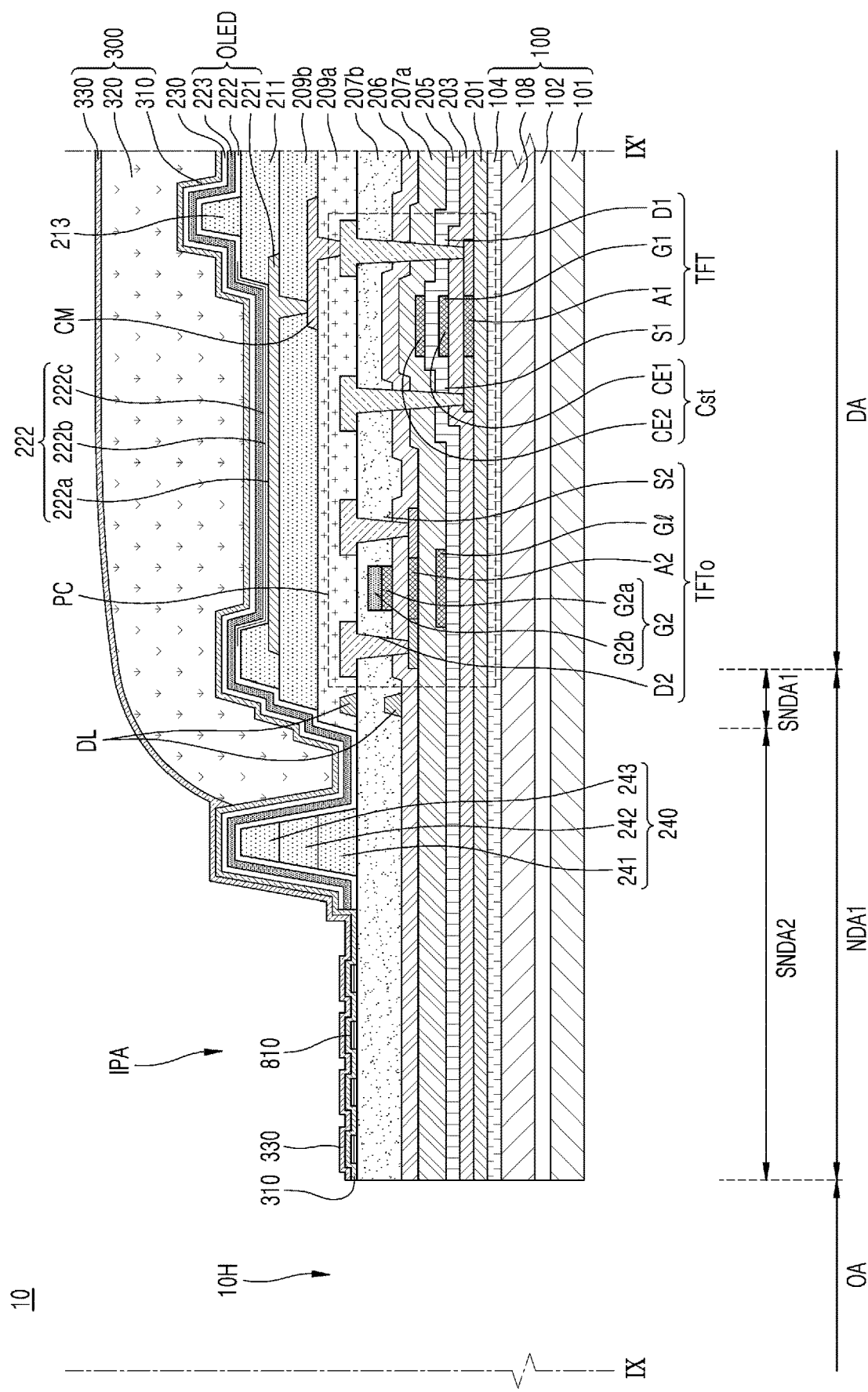
FIG. 8 is a cross-sectional view of a display panel according to some embodiments.

FIG. 8 is a cross-sectional view of the display panel 10 according to some embodiments, taken along the line IX-IX' of FIG. 6.

Referring to FIG. 8, the display panel 10 includes the opening area OA, the display area DA, and the first non-display area NDA1 therebetween. The display panel 10 may include the first opening 10H corresponding to the opening area OA.

Though it is shown that the display panel 10 employs the pixel circuit PC shown in FIG. 7B, the embodiments according to the present disclosure are not limited thereto. The display panel 10 may employ the pixel circuit PC shown in FIG. 7A.

Referring to the display area DA, the first thin film transistor TFT, the second thin film transistor TFTo, and the storage capacitor Cst may be arranged in the display area DA.

The insulating layers 201 to 209b may be arranged between the semiconductor layers and the electrodes of the first thin film transistor TFT and the second thin film transistor TFTo and between the electrodes of the storage capacitor Cst. The organic light-emitting diode OLED and the capping layer 230 may be arranged in the display area DA, the organic light-emitting diode OLED being electrically connected to the pixel circuit PC. A plurality of insulating layers 211 and 213 may be arranged around the organic light-emitting diode OLED.

A thin-film encapsulation layer 300 may cover the organic light-emitting diode OLED including the pixel electrode 221, the intermediate layer 222, and the opposite electrode 223. The thin-film encapsulation layer 300 may include at least one organic encapsulation layer and at least one inorganic encapsulation layer. According to some embodiments, the thin-film encapsulation layer 300 includes a first inorganic encapsulation 310, a second inorganic encapsulation layer 330, and an organic encapsulation layer 320 therebetween. According to some embodiments, the number of organic encapsulation layers, the number of inorganic encapsulation layers, and a stacking sequence of these may be changed.

The first and second inorganic encapsulation layers 310 and 330 may include at least one of inorganic insulating materials including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$) and be formed by chemical vapor deposition (CVD), etc. The organic encapsulation layer 320 may include a polymer-based material. The polymer-based material may include a silicon-based resin, an acryl-based resin, an epoxy-based resin, polyimide, and polyethylene.

The first non-display area NDA1 may include a first sub-non-display area SNDA1 and a second sub-non-display area SNDA2, the first sub-non-display area SNDA1 being relatively close to the display area DA, and the second sub-non-display area SNDA2 being relatively close to the opening area OA or the first opening 10H.

The first sub-non-display area SNDA1 may include a region across which the data lines DL pass. The data lines DL may correspond to data lines detouring the opening area OA. The first sub-non-display area SNDA1 may include a wiring region or a detouring region across which the data lines DL pass.

The data lines DL may be arranged on different layers with the second interlayer insulating layer 207b therebetween and alternately arranged with each other. According to some embodiments, the data lines DL may be arranged on the same insulating layer. In the case where the data lines DL are vertically arranged with an insulating layer therebetween, an interval (a pitch) between the data lines neighboring each other may be reduced, and the width of the first non-display area NDA1 may be reduced. According to some embodiments, the scan lines SL detouring the opening area OA may be also arranged in the first sub-non-display area SNDA1.

The second sub-non-display area SNDA2 may include a region IPA in which at least a portion of the organic material between the substrate 100 and the thin-film encapsulation layer 300 is removed. The dam 240 may be arranged in the second sub-non-display area SNDA2. According to some embodiments, the dam 240 including a plurality of layers may be arranged on the second interlayer insulating layer 207b.

The dam 240 may include a plurality of layers that are stacked. The dam 240 may include a first layer 241, a second layer 242, and a third layer 243, the second layer 242 being on the first layer 241, and the third layer 243 being on the second layer 242. The first layer 241 may be arranged on the same layer as the second planarization layer 209b and may include the same material as the second planarization layer 209b. The second layer 242 may be arranged on the same layer as the pixel-defining layer 211 and may include the same material as the pixel-defining layer 211. The third layer 243 may be arranged on the same layer as the spacer 213 and may include the same material as the spacer 213. As long as the dam 240 includes a plurality of insulating layers among the insulating layers 201 to 213 formed on the substrate 100, the dam 240 is not limited to one of the insulating layers. While the organic encapsulation layer 320 of the thin-film encapsulation layer 300 is formed, the dam 240 may control the flow of the organic encapsulation layer 320.

The first functional layer 222a and the second functional layer 222c of the intermediate layer 222, the opposite electrode 223, and the capping layer 230, each extending from the display area DA, may be arranged on the top surface of the dam 240. The emission layer 222b of the intermediate layer 222 may not be arranged on the dam 240. According to some embodiments, the emission layer 222b may be formed on only the pixel electrode 221.

A pattern layer 810 may be arranged in the region IPA between the dam 240 and the opening area OA. The pattern layer 810 may surround the opening area OA. The pattern layer 810 includes at least a portion of the first functional layer 222a patterned and/or at least a portion of the second functional layer 222c patterned, which are arranged on the second interlayer insulating layer 207b. The at least a portion of the first functional layer 222a that is patterned and/or the at least a portion of the second functional layer 222c that is patterned may include a pattern corresponding to an isolated pattern 920 of a sacrificial layer 910 described during a manufacturing process below. In contrast, the opposite electrode 223 and the capping layer 230 may not be arranged in the region IPA between the dam 240 and the opening area OA.

The first inorganic encapsulation layer 310 may extend from the display area DA to the first non-display area NDA1. In the region IPA between the dam 240 and the opening area OA, the first inorganic encapsulation layer 310 may cover the first functional layer 222a that is patterned and/or the second functional layer 222c that is patterned, and the second interlayer insulating layer 207b exposed between adjacent pattern layers 810. The second inorganic encapsulation layer 330 may cover the first inorganic encapsulation layer 310.

In the region IPA between the dam 240 and the opening area OA, the first inorganic encapsulation layer 310 may contact the second interlayer insulating layer 207b, which is an inorganic insulating layer thereunder. Because the pattern layer 810 is not exposed on the lateral surface of the first opening 10H, the penetration of foreign substances or contaminants such as moisture into the organic light-emitting diode OLED through the first opening 10H may be prevented or reduced.

In the first non-display area NDA1, the first inorganic encapsulation layer 310 may cover the dam 240. The organic encapsulation layer 320 may be formed by coating a monomer and then hardening the same. The flow of the monomer may be controlled by the dam 240. With regard to this, the end of the organic encapsulation layer 320 may be arranged on the lateral surface of the dam 240 facing the display area DA.

Like the first inorganic encapsulation layer 310, the second inorganic encapsulation layer 330 may cover the dam 240. A portion of the second inorganic encapsulation layer 330 may contact the first inorganic encapsulation layer 310. As an example, in the second sub-non-display area SNDA2, a portion of the second inorganic encapsulation layer 330 may contact the first inorganic encapsulation layer 310. The first inorganic encapsulation layer 310 may contact the second inorganic encapsulation layer 330 also on the top surface of the dam 240.

FIGS. 9A to 9E are cross-sectional views sequentially showing a method of manufacturing the display panel 10 according to an embodiment of FIG. 8.

Figure 9A:
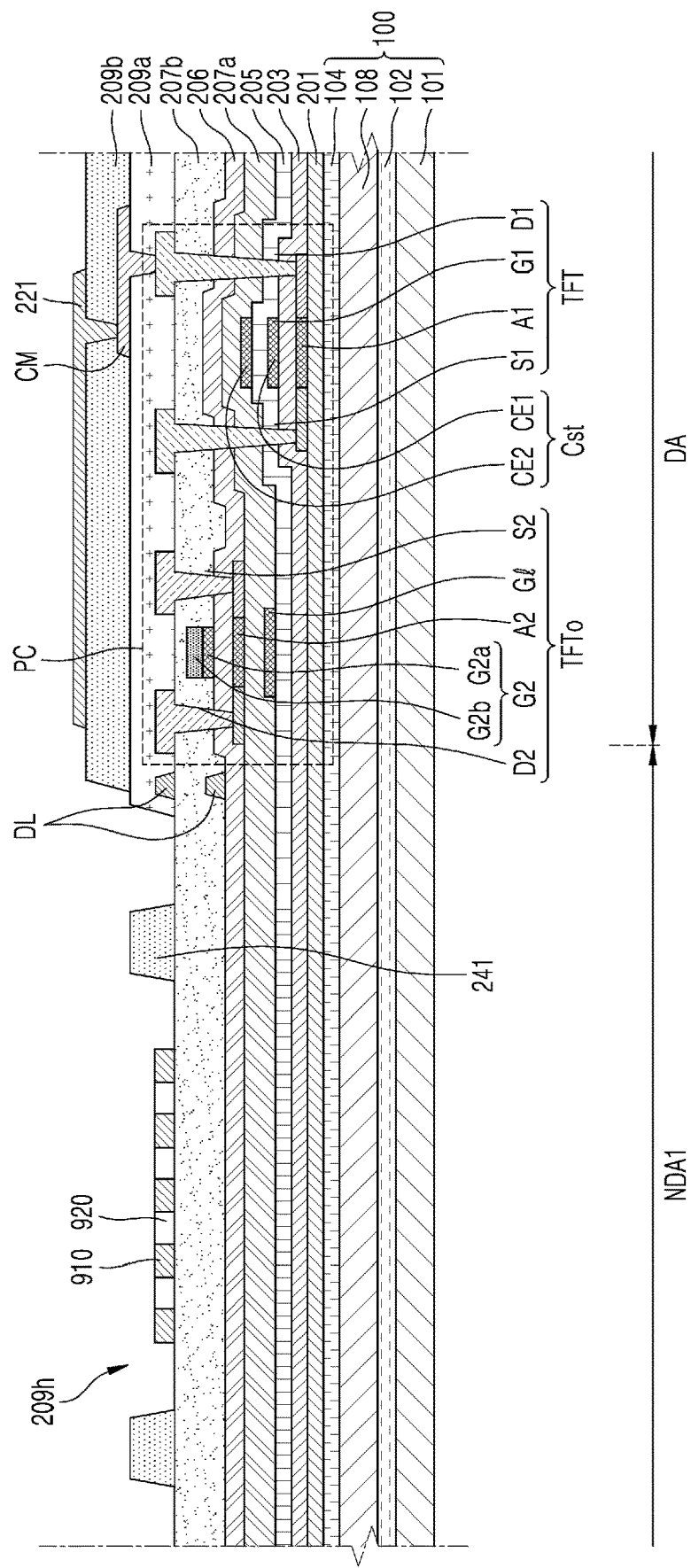
FIGS. 9A to 9E are cross-sectional views sequentially showing a method of manufacturing the display panel of FIG. 8.

Referring to FIG. 9A, the pixel circuit PC is arranged in the display area DA, the pixel circuit PC including one or more thin film transistors, that is, the first thin film transistor TFT and the second thin film transistor TFT0. According to some embodiments, the pixel circuit PC may include the first thin film transistor TFT including a polycrystalline silicon semiconductor and the second thin film transistor TFT0 including an oxide semiconductor.

The sacrificial layer 910 is formed in the first non-display area NDA1.

The sacrificial layer 910 is simultaneously (or concurrently) formed while elements of the pixel circuit PC are formed. A first opening 209h is formed by etching the first planarization layer 209a arranged on the second interlayer insulating layer 207b. In the display area DA, the common metal CM is formed on the first planarization layer 209a. The second planarization layer 209b is formed on the connection metal CM. The pixel electrode 221 is formed on the second planarization layer 209b, the pixel electrode 221 being connected to the connection metal CM. In the first non-display area NDA1, the first layer 241 of the dam 240 is formed in plural during the same process as a process of forming the second planarization layer 209b. The first layer 241 is arranged on the second interlayer insulating layer 207b.

The sacrificial layer 910 is formed on the second interlayer insulating layer 207b through the first opening 209h. The sacrificial layer 910 is formed between the first layers 241 of the dam 240 that are apart from each other. The sacrificial layer 910 may be simultaneously (or concurrently) formed with the pixel electrode 221 and may include the same material as the pixel electrode 221, the pixel electrode 221 being electrically connected to the pixel circuit PC. The sacrificial layer 910 may include a conductive oxide, metal, or metal compound. The sacrificial layer 910 may further include a layer on and under the reflective layer including metal, the layer including ITO, IZO, ZnO, or $In_2O_3$. As an example, the sacrificial layer 910 may have a stack structure of ITO/Ag/ITO.

The sacrificial layer 910 may have a plurality of isolated pattern holes 920. According to some embodiments, the plurality of isolated pattern holes 920 of the sacrificial layer 910 are apart from each other and pass through the sacrificial layer 910 in a thickness direction.

Figure 10A:
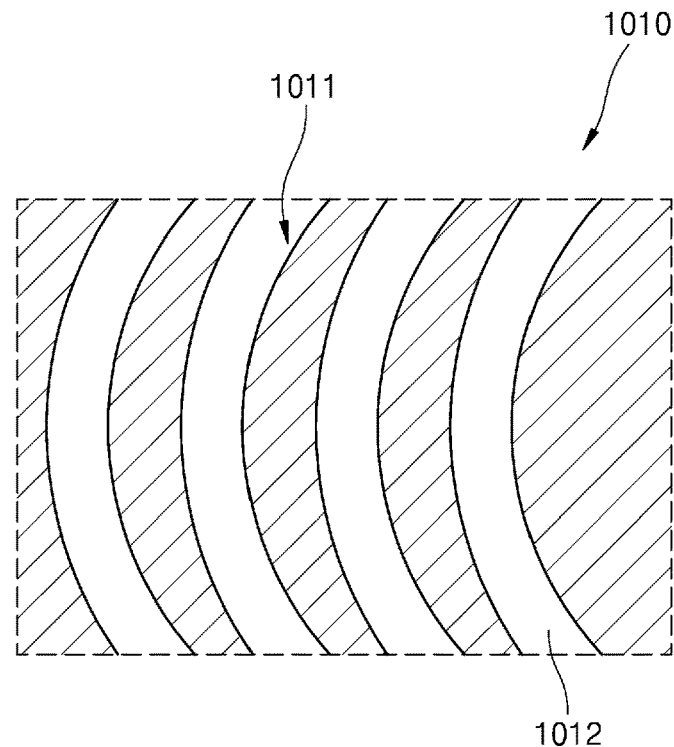
FIGS. 10A to 10C are enlarged plan views of a sacrificial layer according to some embodiments.
Figure 10B:
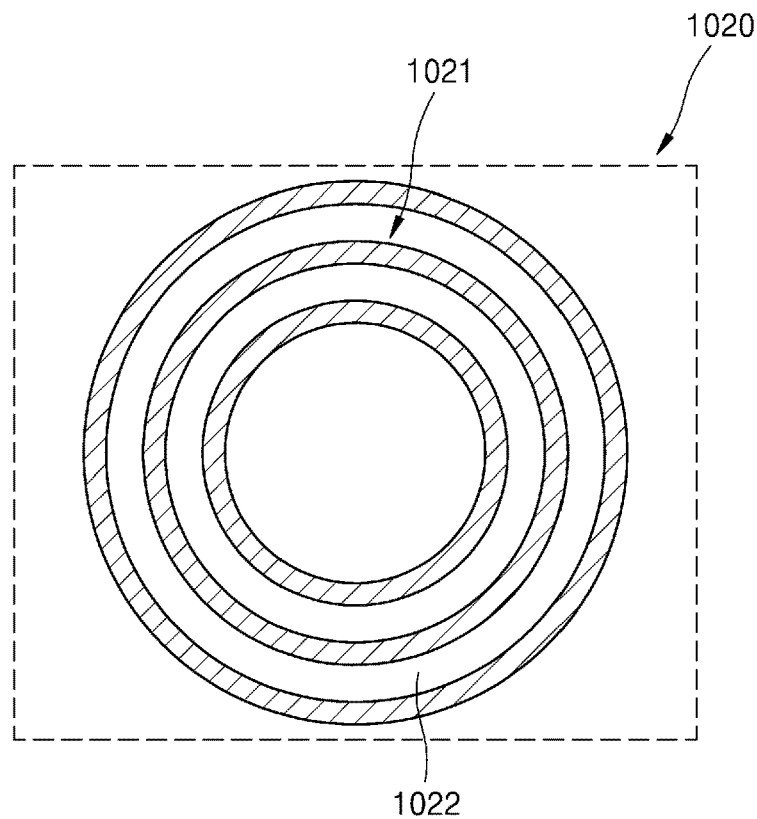
Figure 10C:
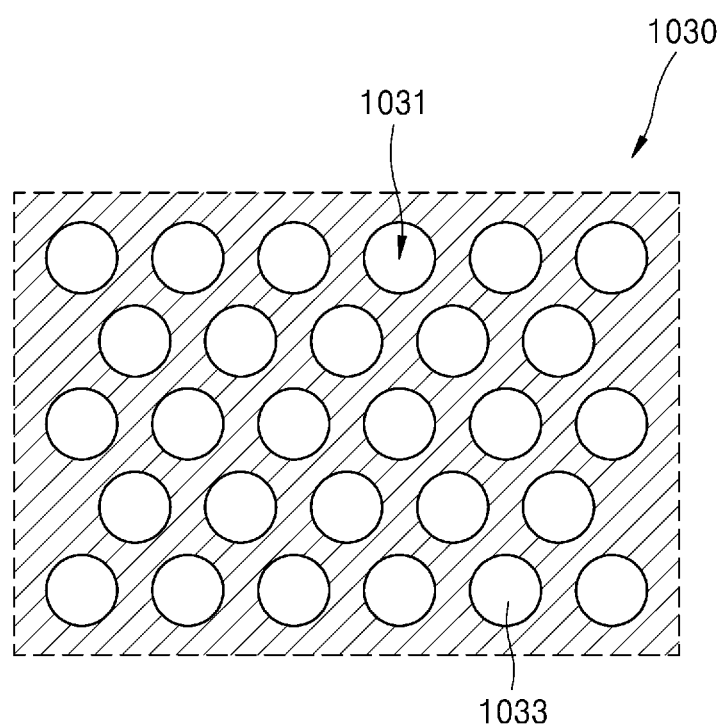

Referring to FIG. 10A, an isolated pattern hole 1011 may include a multi-circle type pattern hole 1012 formed over the entire region of a sacrificial layer 1010. The isolated pattern hole 1011 may have a wave pattern shape. Referring to FIG. 10B, an isolated pattern hole 1021 may include a multi-circle type pattern hole 1022 formed over the entire region of a sacrificial layer 1020. The isolated pattern hole 1021 may be concentric. Referring to FIG. 10C, an isolated pattern hole 1031 may include a plurality of dot type pattern holes 1033 formed over the entire region of a sacrificial layer 1030. As far as the sacrificial layer includes an isolated pattern hole, not a solid pattern, the sacrificial layer according to some embodiments is not limited to one of the sacrificial layers.

Figure 9B:
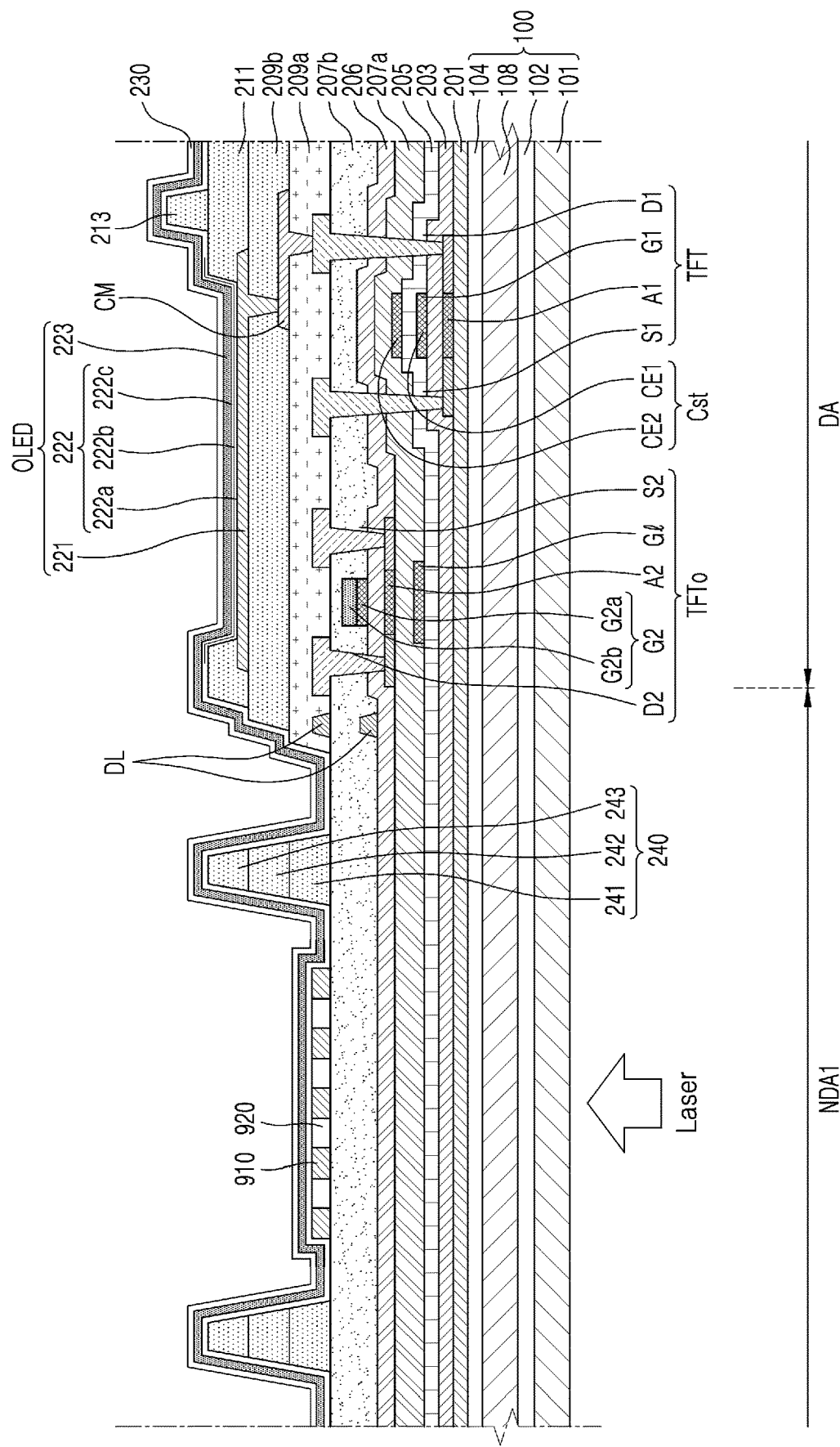

Referring to FIG. 9B, in the display area DA, the pixel-defining layer 211 is formed on the pixel electrode 221. The pixel-defining layer 211 exposes a portion of the pixel electrode 221. The spacer 213 is formed on the pixel-defining layer 211. The dam 240 is formed in the first non-display area NDA1, the dam 240 including the first layer 241, the second layer 242, and the third layer 243. The second layer 242 is formed during the same process as a process of forming the pixel-defining layer 211. The third layer 243 is formed during the same process as a process of forming the spacer 213. The sacrificial layer 910 is arranged between the dams 240 having a triple-layered structure that are apart from each other.

The organic light-emitting diode OLED is formed in the display area DA, the organic light-emitting diode OLED being electrically connected to the pixel circuit PC. In the first non-display area NDA1, the first functional layer 222a, the second functional layer 222c, the opposite electrode 223, and the capping layer 230 are sequentially stacked on the top surface of the dam 240 and the top surface of the sacrificial layer 910. The first functional layer 222a, the second functional layer 222c, the opposite electrode 223, and the capping layer 230 are formed on the entire surface of the substrate 100. The first functional layer 222a, the second functional layer 222c, the opposite electrode 223, and the capping layer 230 extend as one body on the top surface of the dam 240 and the sacrificial layer 910 including the isolated pattern hole 920. In contrast, the emission layer 222b of the intermediate layer 222 is formed on only the pixel electrode 221.

Figure 11A:
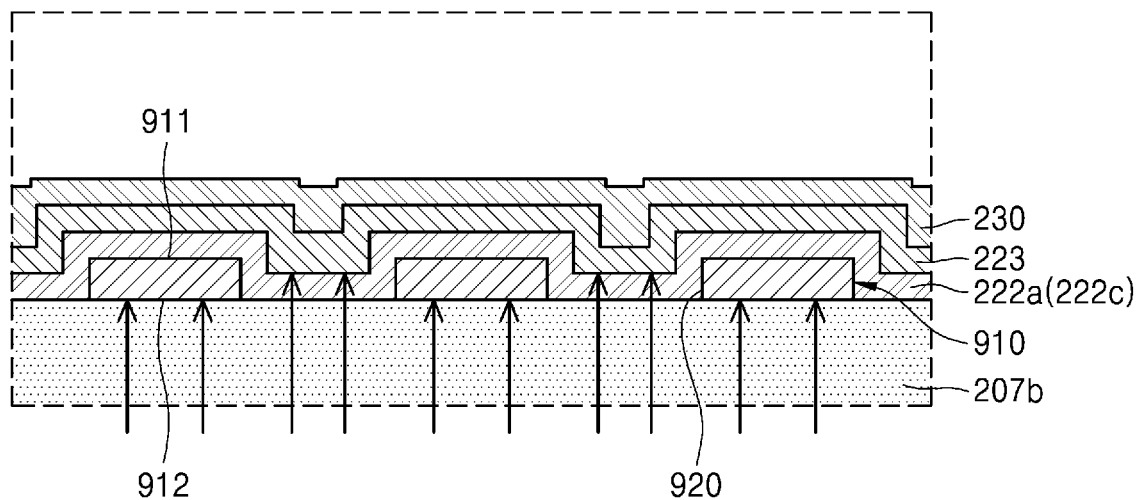
FIG. 11A is an enlarged cross-sectional view of a laser beam irradiated on a sacrificial layer of FIG. 9B according to some embodiments.

As shown in FIG. 11A, the sacrificial layer 910 includes the isolated pattern hole 920. The first functional layer 222a and the second functional layer 222c extend as one body on a first surface 911 of the sacrificial layer 910 and inside the isolated pattern hole 920. The first surface 911 of the sacrificial layer 910 may include a surface in a direction away from the second interlayer insulating layer 207b. The opposite electrode 223 extends on the first functional layer 222a and the second functional layer 222c over the sacrificial layer 910 and the isolated pattern hole 920. The capping layer 230 is formed on the opposite electrode 223.

Next, a laser beam is irradiated to the sacrificial layer 910 from below the substrate 100. According to some embodiments, the laser beam progresses in the thickness direction of the substrate 100 from below the substrate 100 and is irradiated to the sacrificial layer 910. The laser beam may have an infrared wavelength. In the case where the laser beam is an infrared ray, because a transmittance of the substrate 100 and the insulating layers 201 to 207b is about 80% to 90% or more, the laser beam efficiently reaches the sacrificial layer 910.

The laser beam is irradiated to a second surface 912 of the sacrificial layer 910 that faces the second interlayer insulating layer 207b, simultaneously (or concurrently) passes through the first functional layer 222a and the second functional layer 222c filling the isolated pattern 920, and is irradiated to a surface of the opposite electrode 223.

When the laser beam is irradiated to the sacrificial layer 910, the sacrificial layer 910 absorbs the laser beam. Accordingly, the sacrificial layer 910 thermally expands and the second surface 912 of the sacrificial layer 910 to which the laser beam is irradiated is lifted off (or removed) from the surface of the second interlayer insulating layer 207b. As the sacrificial layer 910 is lifted off (or removed), the first functional layer 222a, the second functional layer 222c, the opposite electrode 223, and the capping layer 230 on the sacrificial layer 910 may be removed together with the sacrificial layer 910.

In addition, a portion of the laser beam is irradiated to a surface of the opposite electrode 223 through the isolated pattern hole 920. Because the laser beam includes an infrared ray, the first functional layer 222a and the second functional layer 222c, each including an organic material, are not influenced by the laser beam. The laser beam may be directly irradiated to the surface of the opposite electrode 223. Accordingly, the opposite electrode 223 absorbs the laser beam. The opposite electrode 223 to which the laser beam is irradiated may thermally expand and be lifted off (or removed) from the first functional layer 222a and the second functional layer 222c. The capping layer 230 arranged on the opposite electrode 223 may be removed together with the opposite electrode 223.

In this case, the first functional layer 222a and the second functional layer 222c arranged between the second interlayer insulating layer 207b and the opposite electrode 223 are left on the second interlayer insulating layer 207b. Substantially, the first functional layer 222a and the second functional layer 222c may be tens of times greater than the opposite electrode 223. Accordingly, while the opposite electrode 223 is removed, the first functional layer 222a and the second functional layer 222c are not influenced by the melting of the opposite electrode and left on the second interlayer insulating layer 207b.

Figure 11B:
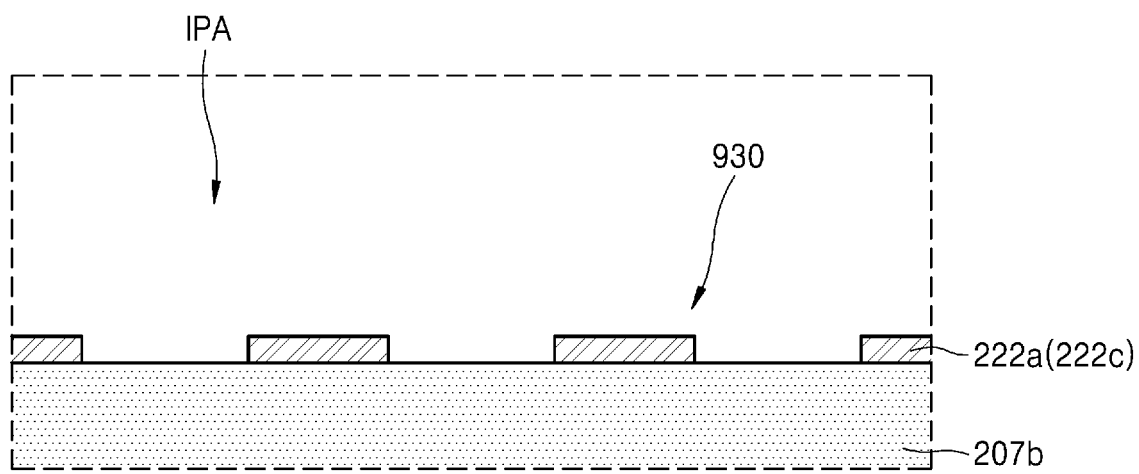
FIG. 11B is an enlarged cross-sectional view of a pattern layer after the sacrificial layer of FIG. 11A is removed according to some embodiments.

Accordingly, as shown in FIG. 11B, a pattern layer 930 remains in the region IPA between the dam 240 and the opening area OA, the pattern layer 930 corresponding to the first functional layer 222a that is patterned and the second functional layer 222c that is patterned. As described above, the region IPA between the dam 240 and the opening area OA is a region from which the sacrificial layer 910 is removed. The region IPA may include a region in which the isolated pattern of the pattern layer 930 is formed. The first functional layer 222a and the second functional layer 222c remaining on the second interlayer insulating layer 207b include a pattern corresponding to the isolated pattern hole 920 of the sacrificial layer 910.

Figure 9C:
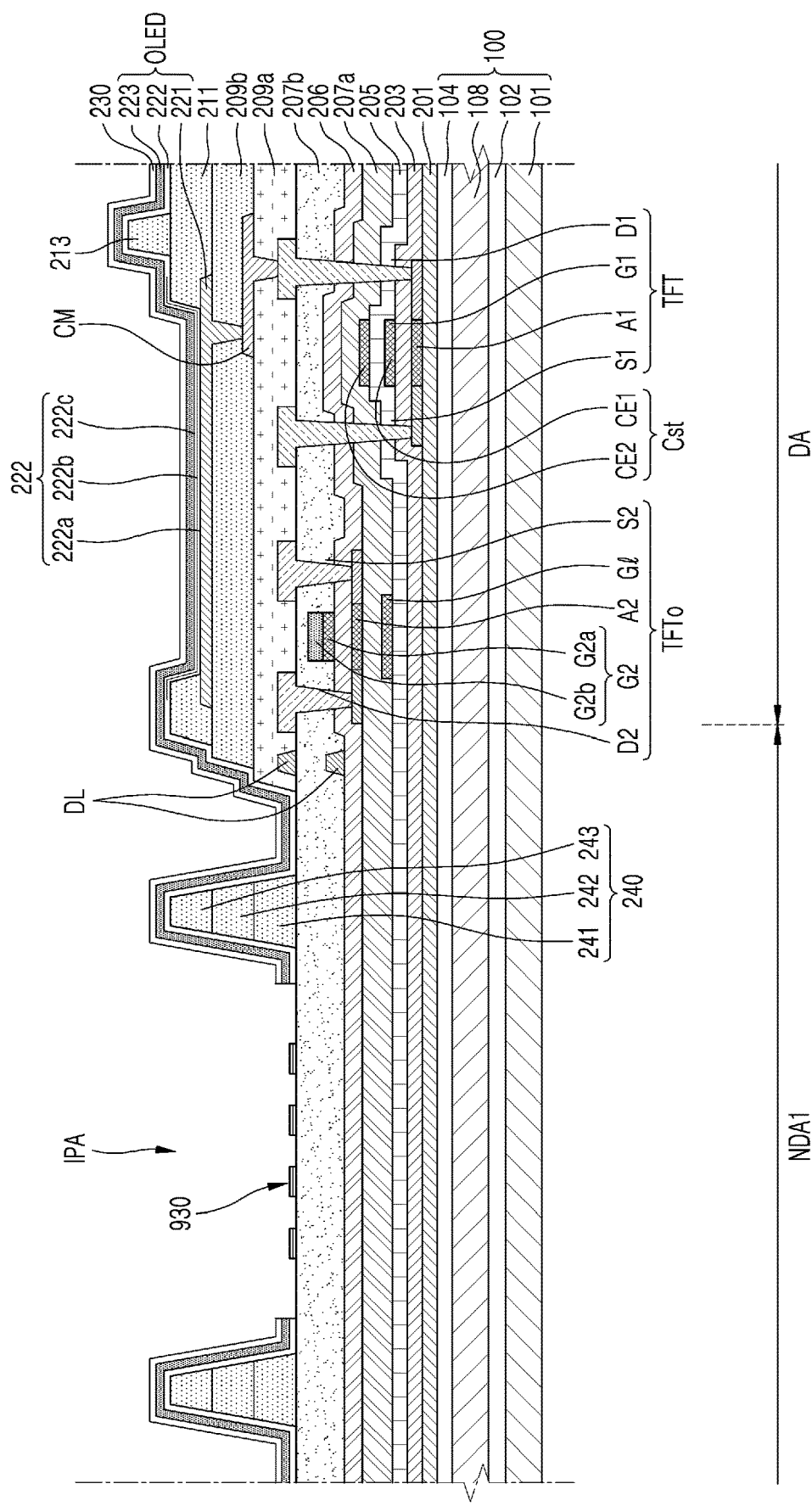

When the sacrificial layer 910 is lifted off (or removed) from the second interlayer insulating layer 207b, as shown in FIG. 9C, the pattern layer 930, that is, the first functional layer 222a that is patterned and the second functional layer 222c that is patterned are left in the region IPA from which the sacrificial layer 910 is removed. In contrast, there is no opposite electrode 223 and no capping layer 230. The pattern layer 930 including the first functional layer 222a that is patterned and the second functional layer 222c that is patterned, each remaining on the second interlayer insulating layer 207b, may surround the opening area OA (see, e.g., FIG. 8).

Figure 9D:
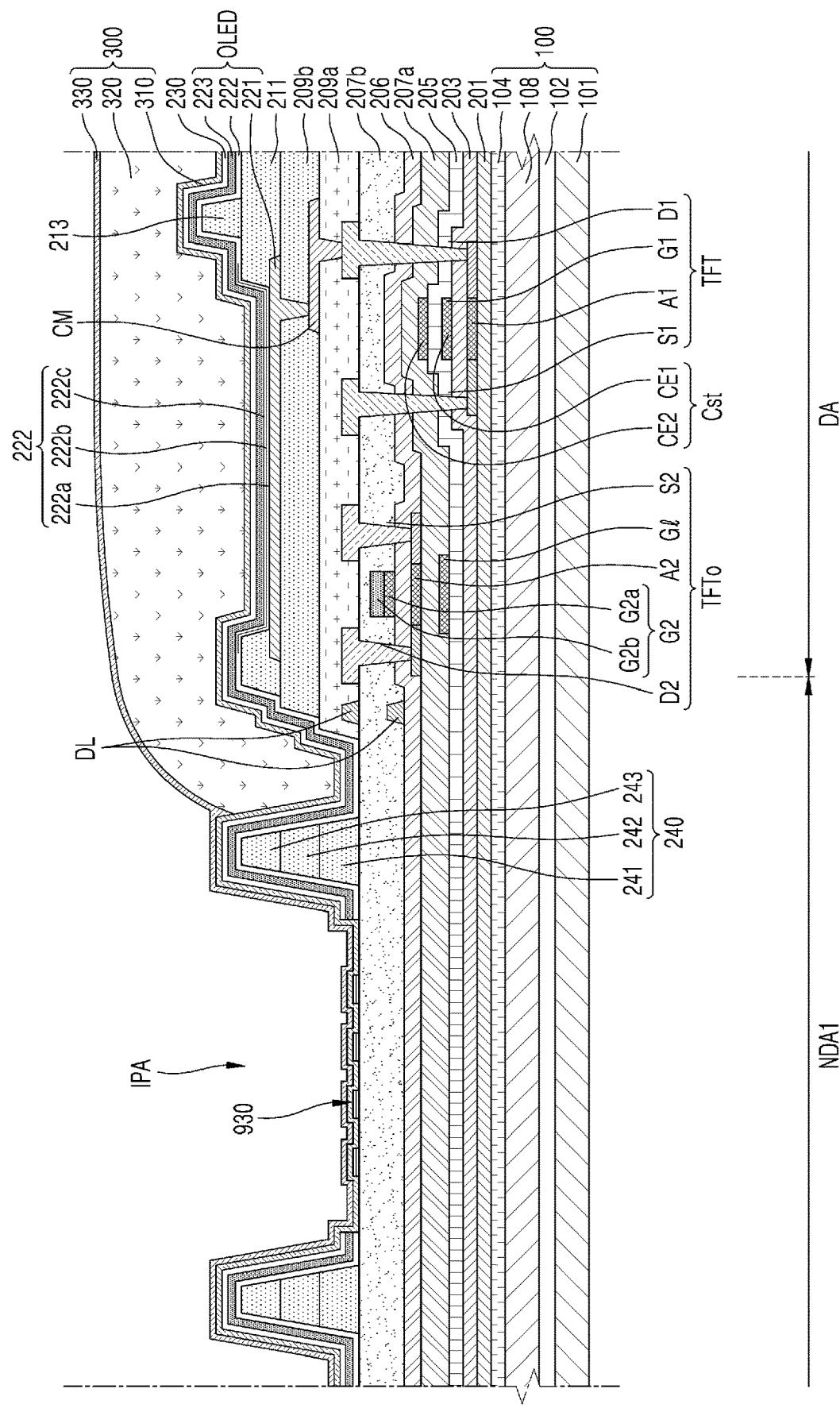

Next, referring to FIG. 9D, the thin-film encapsulation layer 300 is formed over the substrate 100. The first inorganic encapsulation layer 310 and the second inorganic encapsulation layer 330 are formed over the entire surface of the substrate 100. The first inorganic encapsulation layer 310 extends from the display area DA to the region IPA from which the sacrificial layer 910 is removed through the dam 240. In the region IPA from which the sacrificial layer 910 is removed, the first inorganic encapsulation layer 310 covers the first functional layer 222a that is patterned and the second functional layer 222c that is patterned, each remaining on the second interlayer insulating layer 207b, and the second interlayer insulating layer 207b exposed between adjacent pattern layers 930.

The organic encapsulation layer 320 is formed on the first inorganic encapsulation layer 310. The end of the organic encapsulation layer 320 is arranged on the lateral portion of the dam 240 that faces the display area DA. The dam 240 may control the flow of the organic encapsulation layer 320.

The second inorganic encapsulation layer 330 is formed on the organic encapsulation layer 320. Like the first inorganic encapsulation layer 310, the second inorganic encapsulation layer 330 extends from the display area DA to the region IPA from which the sacrificial layer 910 is removed through the dam 240. In the region IPA from which the sacrificial layer 910 is removed, the second inorganic encapsulation layer 330 directly contacts the first inorganic encapsulation layer 310.

Figure 9E:
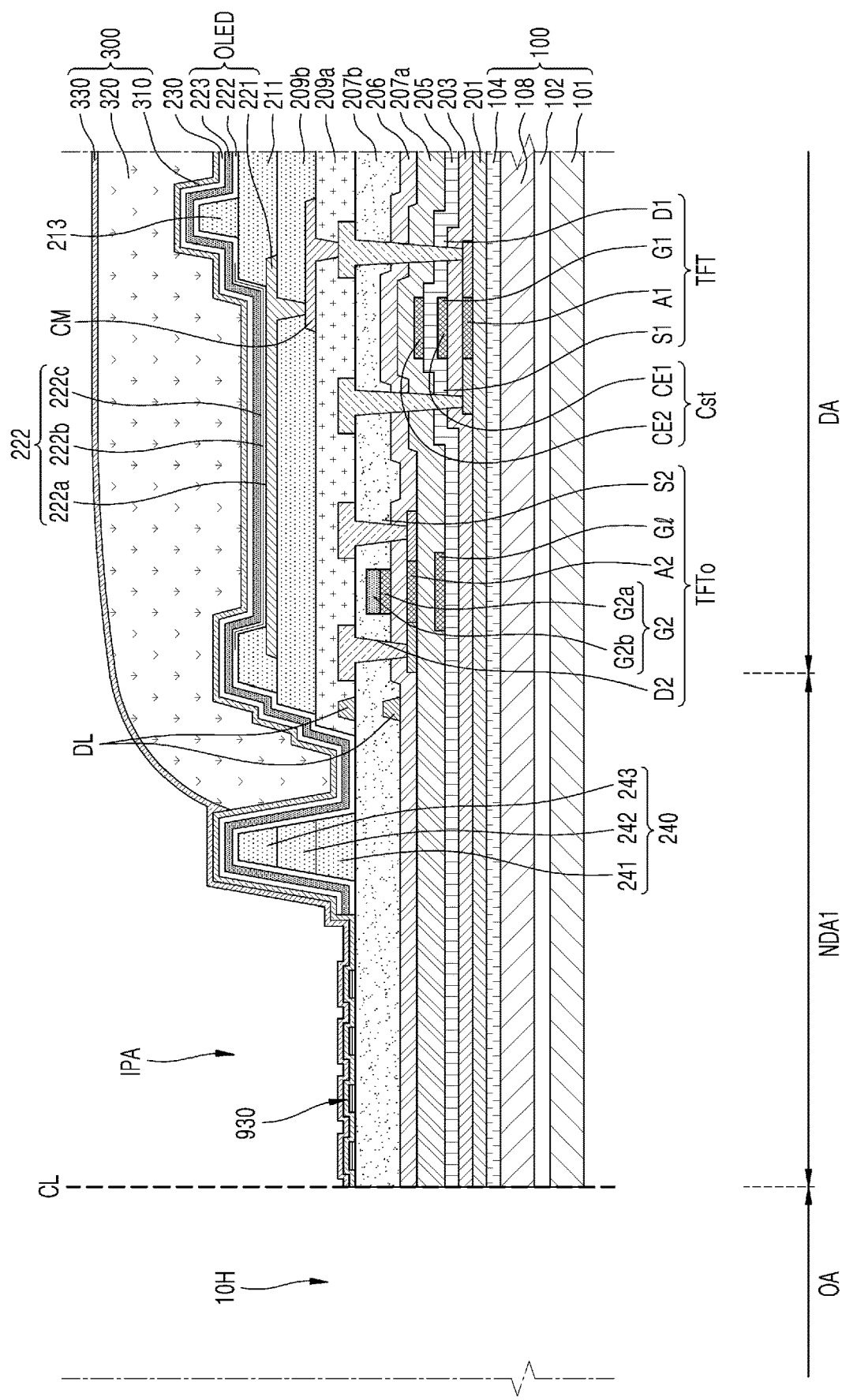

Subsequently, referring to FIG. 9E, the first opening 10H is formed by cutting the substrate 100 and the insulating layers 201 to 330 stacked on the substrate 100, along a cutting line CL. Because the first functional layer 222a, the second functional layer 222c, and the capping layer 230 each including the organic material are not exposed through the lateral wall of the first opening 10H, the penetration of moisture or other contaminants into the organic light-emitting diode OLED through the first opening 10H may be prevented or reduced.

Figure 12A:
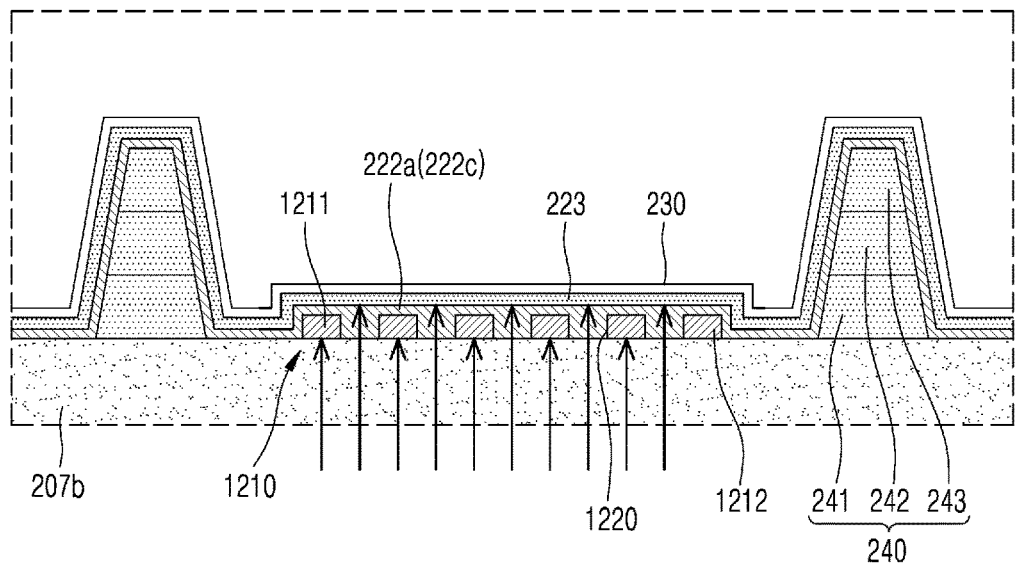
FIG. 12A is a view of a modified example of FIG. 9B according to some embodiments.

FIG. 12A is a view of a modified example of FIG. 9B.

In FIG. 12A, because the same reference numerals as those of FIG. 9B denote the same elements, repeated descriptions thereof are omitted.

Referring to FIG. 12A, the sacrificial layer 1210 includes an isolated pattern hole 1220. The first functional layer 222a and the second functional layer 222c are formed on the sacrificial layer 1210 and the isolated pattern hole 1220. The opposite electrode 223 is formed on the first functional layer 222a and the second functional layer 222c. The capping layer 230 is formed on the opposite electrode 223. The sacrificial layer 1210 is formed during the same process as a process of forming the pixel electrode 221 (see, e.g., FIG. 8) electrically connected to the pixel circuit PC and includes the same material as the pixel electrode 221.

A laser beam is irradiated to the sacrificial layer 1210 to lift off the sacrificial layer 1210. The laser beam is irradiated to a surface of the sacrificial layer 1210 that faces the second interlayer insulating layer 207b, simultaneously (or concurrently) passes through the first functional layer 222a and the second functional layer 222c filling the isolated pattern 1220, and is irradiated to a surface of the opposite electrode 223.

While the laser beam is irradiated, unlike FIG. 9B, the laser beam may not be irradiated to a portion 1212 of the sacrificial layer 1210 that neighbors the dam 240 due to the characteristics of a laser device. The portion 1212 of the sacrificial layer 1210 may correspond to the right edge of the sacrificial layer 1010 of FIG. 10A.

When the laser beam is irradiated to the sacrificial layer 1210 and the opposite electrode 223, the sacrificial layer 1210 is lifted off (or removed) from the surface of the second interlayer insulating layer 207b, and the opposite electrode 223 is lifted off (or removed) from the first functional layer 222a and the second functional layer 222c. In addition, unlike the case of FIG. 9B, the first functional layer 222a and the second functional layer 222c remaining on the second interlayer insulating layer 207b are additionally removed. As an example, in the case where the thicknesses of the first functional layer 222a and the second functional layer 222c are similar to the thickness of the opposite electrode 223, the first functional layer 222a and the second functional layer 222c may be also removed by residual heat of the opposite electrode 223.

Figure 12B:
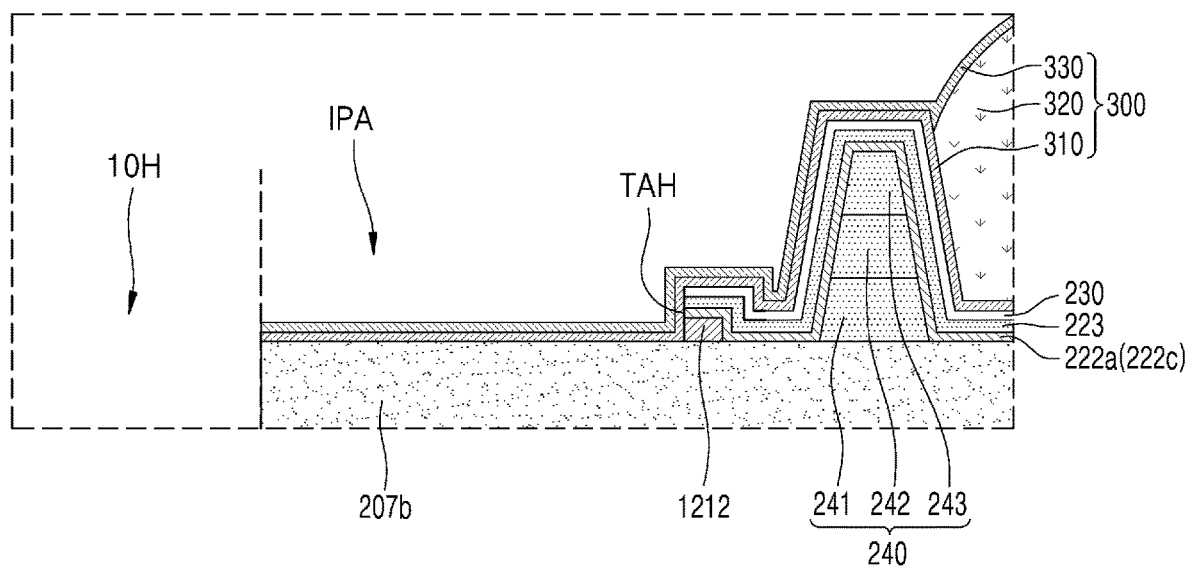
FIG. 12B is an enlarged cross-sectional view of a portion of a display panel after a sacrificial layer of FIG. 12A is removed according to some embodiments.

When the sacrificial layer 1210 is lifted off (or removed) from the second interlayer insulating layer 207b, as shown in FIG. 12B, there is no first functional layer 222a, no second functional layer 222c, no opposite electrode 223, and no capping layer 230 in the region IPA from which the sacrificial layer 1210 is removed. However, because heat energy is not applied to a portion 1212 of the sacrificial layer 1210, the portion 1212 of the sacrificial layer 1210 remains on the second interlayer insulating layer 207b. The portion 1212 of the sacrificial layer 1210 includes a portion to which the laser beam is not irradiated and which does not thermally expand. The portion 1212 of the sacrificial layer 1210 may be arranged between the dam 240 and the opening area OA. As an example, the portion 1212 of the sacrificial layer 1210 may neighbor the dam 240. The first functional layer 222a, the second functional layer 222c, the opposite electrode 223, and the capping layer 230 may extend over the dam 240 and the portion 1212 of the sacrificial layer 1210.

A transmission hole TAH may be arranged between the portion 1212 of the sacrificial layer 1210 and the opening area OA, the transmission hole TAH including openings of the first functional layer 222a, the second functional layer 222c, the opposite electrode 223, and the capping layer 230. The portion 1212 of the sacrificial layer 1210 may contact the transmission hole TAH including the openings of the first functional layer 222a, the second functional layer 222c, the opposite electrode 223, and the capping layer 230. The first functional layer 222a, the second functional layer 222c, the opposite electrode 223, and the capping layer 230 may be sequentially stacked on the portion 1212 of the sacrificial layer 1210.

The first inorganic encapsulation layer 310 may cover the outer surface of the dam 240 and the portion 1212 of the sacrificial layer 1210 and extend to the region IPA from which the sacrificial layer 1210 is removed. Like the first inorganic encapsulation layer 310, the second inorganic encapsulation layer 330 may extend to the region IPA from which the sacrificial layer 1210 is removed and directly contact the first inorganic encapsulation layer 310.

In a display panel and a method of manufacturing the display panel according to some embodiments, particles that occur during a process of removing a sacrificial layer formed in a non-display area around an opening area through a laser-lift method may be easily removed.

The characteristics of embodiments according to the present disclosure may be derived from the descriptions below with reference to the drawings besides the above descriptions.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A method of manufacturing a display panel, the display panel including a substrate including an opening area, a display area, and a non-display area, the display area surrounding the opening area, and the non-display area being between the opening area and the display area, the method comprising:
    forming a pixel circuit in the display area, the pixel circuit including at least one thin film transistor;
    forming a sacrificial layer on an insulating layer in the non-display area, the sacrificial layer including an isolated pattern hole;
    forming functional layers and an opposite electrode of an intermediate layer of an organic light-emitting diode that extends over the display area and the non-display area, the functional layers and the opposite electrode covering the sacrificial layer including the isolated pattern hole;
    irradiating a laser beam to the opposite electrode through the sacrificial layer and the isolated pattern hole from below the substrate; and
    lifting off the sacrificial layer from the insulating layer and simultaneously, lifting off the opposite electrode to which the laser beam is irradiated,
    wherein at least a portion of the functional layers is left on a portion of the insulating layer corresponding to the opposite electrode that is removed.

2. The method of claim 1, wherein the functional layers extend as one body on a first surface of the sacrificial layer in a direction away from the insulating layer and the isolated pattern hole, and the opposite electrode extends on the functional layers.

3. The method of claim 1, wherein irradiating the laser beam further comprises passing the laser beam through a second surface of the sacrificial layer facing the insulating layer and the functional layers that fill the isolated pattern hole, and is simultaneously irradiated on one surface of the opposite electrode.

4. The method of claim 3, wherein the second surface of the sacrificial layer is removed from the insulating layer,
    a portion of the opposite electrode that is arranged in the isolated pattern hole is removed from a functional layer from among the functional layers, and
    the functional layer between the insulating layer and the opposite electrode is left on the insulating layer.

5. The method of claim 4, wherein the functional layer left on the insulating layer includes a pattern corresponding to the isolated pattern hole.

6. The method of claim 1, wherein the isolated pattern hole includes a multi-circle type pattern hole formed over an entire area of the sacrificial layer.

7. The method of claim 1, wherein the isolated pattern hole includes a plurality of dot type pattern holes formed over an entire area of the sacrificial layer.

8. The method of claim 1, wherein the sacrificial layer is formed through a same process as a process of forming a pixel electrode of the organic light-emitting diode formed in the display area and includes a same material as the pixel electrode.

9. The method of claim 1, further comprising:
   forming a dam in the non-display area through a same process as a process of forming a plurality of insulating layers of an insulating layer arranged between the at least one thin film transistor and each element of the organic light-emitting diode,
   wherein the functional layers and the opposite electrode extend as one body on an outer surface of the dam and on the sacrificial layer including the isolated pattern hole.

10. The method of claim 1, wherein the functional layer left on the insulating layer surrounds the opening area in the non-display area corresponding to the sacrificial layer.

11. The method of claim 1, further comprising:
   forming a thin-film encapsulation layer over the display area and the non-display area,
   wherein at least one inorganic encapsulation layer of the thin-film encapsulation layer extends to a region in which the sacrificial layer is removed.

12. The method of claim 11, wherein the at least one inorganic encapsulation layer covers the portion of the functional layer left on the insulating layer and an insulating layer exposed between adjacent functional layers.

13. The method of claim 1, wherein the intermediate layer includes:
   an emission layer in the display area; and
   at least one functional layer on a surface of the emission layer and extending from the display area to the non-display area.

* * * * *